United States Patent
Yamada et al.

(10) Patent No.: US 11,387,210 B2
(45) Date of Patent: Jul. 12, 2022

(54) SEMICONDUCTOR MODULE AND MANUFACTURING METHOD THEREFOR

(71) Applicant: FUJI ELECTRIC CO., LTD., Kanagawa (JP)

(72) Inventors: Takafumi Yamada, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/794,236

(22) Filed: Feb. 19, 2020

(65) Prior Publication Data
US 2020/0294953 A1    Sep. 17, 2020

(30) Foreign Application Priority Data

Mar. 15, 2019 (JP) .............................. JP2019-048215
Nov. 15, 2019 (JP) .............................. JP2019-207470

(51) Int. Cl.
| | | |
|---|---|---|
| *H01L 21/56* | (2006.01) | |
| *H01L 23/31* | (2006.01) | |
| *H01L 21/48* | (2006.01) | |
| *H01L 23/29* | (2006.01) | |
| *H01L 23/00* | (2006.01) | |

(52) U.S. Cl.
CPC .......... *H01L 24/45* (2013.01); *H01L 21/4885* (2013.01); *H01L 21/56* (2013.01); *H01L 23/29* (2013.01); *H01L 23/3164* (2013.01); *H01L 24/43* (2013.01)

(58) Field of Classification Search
None
See application file for complete search history.

(56) References Cited

U.S. PATENT DOCUMENTS 7,071,559 B2 * 7/2006 Awad ...................... H01L 24/02
                                                                257/758
9,550,670 B2 * 1/2017 Geissler .............. B81C 1/00261
(Continued)

FOREIGN PATENT DOCUMENTS

DE      112017007029 T5    10/2019
JP          H0521653 A       1/1993
(Continued)

OTHER PUBLICATIONS

Wepages of Material Property Data for elastic modulus of silicone, 3 pages.*
(Continued)

*Primary Examiner* — Bo B Jang

(57) ABSTRACT

A semiconductor module is provided, including: a semiconductor chip having an upper surface electrode and a lower surface electrode opposite to the upper surface electrode; a metal wiring plate electrically connected to the upper surface electrode of the semiconductor chip; and a sheet-like low elastic sheet provided on the metal wiring plate, the low elastic sheet having elastic modulus lower than that of the metal wiring plate. A manufacturing method for a semiconductor module is provided, including: providing a semiconductor chip; solder-bonding a metal wiring plate above said semiconductor chip; and applying a sheet-like low elastic sheet having the elastic modulus lower than that of said metal wiring plate to said metal wiring plate.

12 Claims, 19 Drawing Sheets

(56) References Cited

U.S. PATENT DOCUMENTS

| | | | |
|---|---|---|---|
| 9,881,846 B2* | 1/2018 | Yamada | H01L 23/3735 |
| 9,917,064 B2* | 3/2018 | Ishiyama | H01L 23/3185 |
| 10,068,825 B2 | 9/2018 | Negishi | |
| 10,242,940 B2* | 3/2019 | Yeh | H01L 23/49816 |
| 11,101,225 B2* | 8/2021 | Harada | H01L 23/047 |
| 2006/0012045 A1* | 1/2006 | Awad | H01L 23/562 |
| | | | 257/758 |
| 2008/0258318 A1* | 10/2008 | Kimura | H01L 23/3121 |
| | | | 257/793 |
| 2015/0076517 A1 | 3/2015 | Terai | |
| 2015/0266728 A1* | 9/2015 | Geissler | B81C 1/00261 |
| | | | 438/51 |
| 2016/0111379 A1* | 4/2016 | Ishiyama | H01L 23/00 |
| | | | 257/669 |
| 2017/0033028 A1* | 2/2017 | Negishi | H01L 21/02271 |
| 2017/0117201 A1 | 4/2017 | Yamada | |
| 2018/0108602 A1* | 4/2018 | Yeh | H01L 23/3128 |
| 2018/0123014 A1* | 5/2018 | Zoller | H01L 35/32 |
| 2020/0098701 A1* | 3/2020 | Harada | H01L 23/49586 |

FOREIGN PATENT DOCUMENTS

| | | |
|---|---|---|
| JP | 2003115512 A | 4/2003 |
| JP | 2006351737 A | 12/2006 |
| JP | 2011228336 A | 11/2011 |
| JP | 2014057005 A | 3/2014 |
| JP | 2015018860 A | 1/2015 |
| JP | 2015115382 A | 6/2015 |
| JP | 2015115471 A | 6/2015 |
| JP | 2015156466 A | 8/2015 |
| JP | 2016111089 A | 6/2016 |
| JP | 2017084881 A | 5/2017 |
| JP | 2018098442 A | 6/2018 |
| WO | 2013011276 A2 | 1/2013 |
| WO | 2013111276 A1 | 8/2013 |
| WO | 2015166737 A1 | 11/2015 |
| WO | 2018159678 A1 | 9/2018 |

OTHER PUBLICATIONS

Wepages of Material Property Data for elastic modulus of copper, 3 pages.*

Office Action issued for counterpart Japanese Application No. 2019-048215, issued by the Japanese Patent Office dated Jun. 18, 2019 (dated Jun. 10, 2019).

Office Action issued for counterpart German Application 102020105510.2, issued by the German Patent and Trade Mark Office dated Dec. 7, 2021.

* cited by examiner

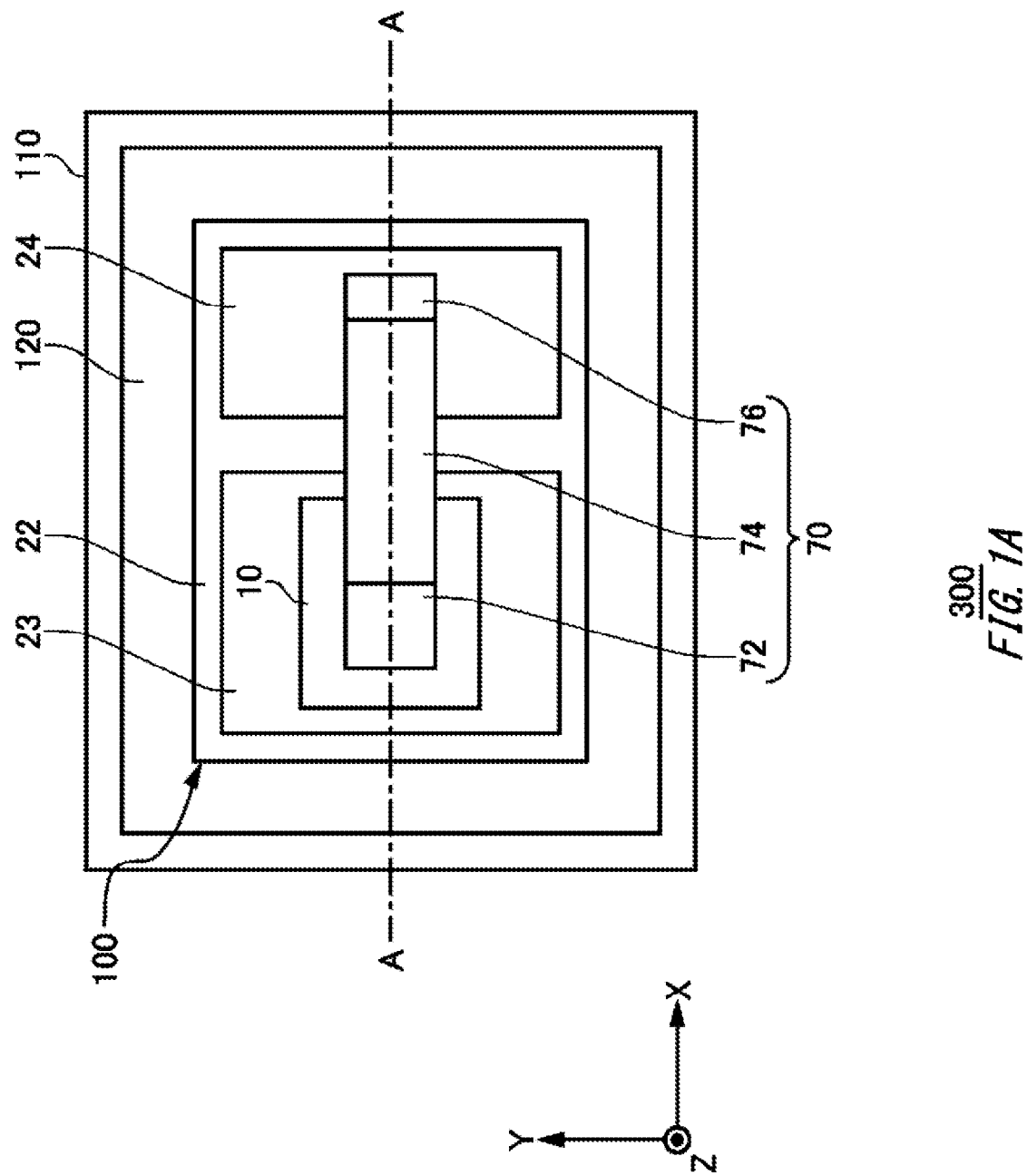

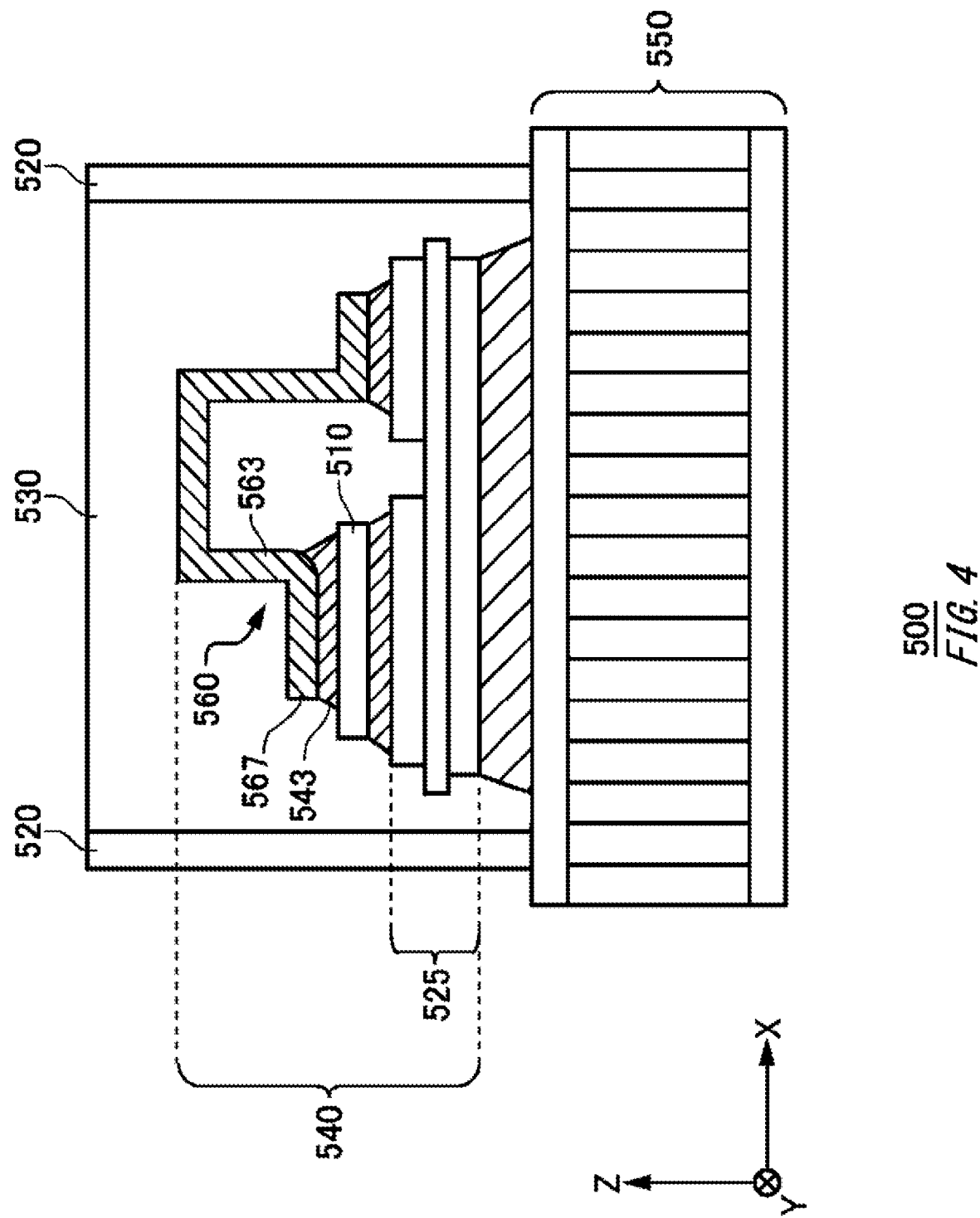

S300
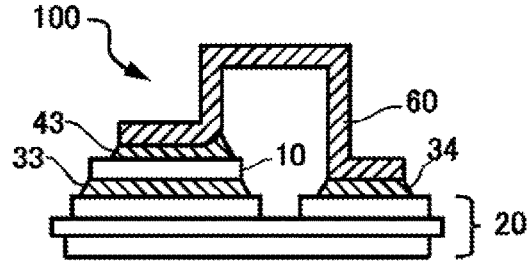
S302
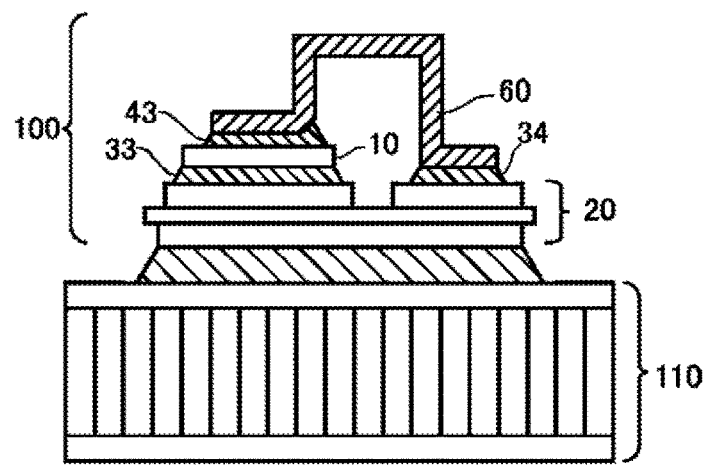
S304
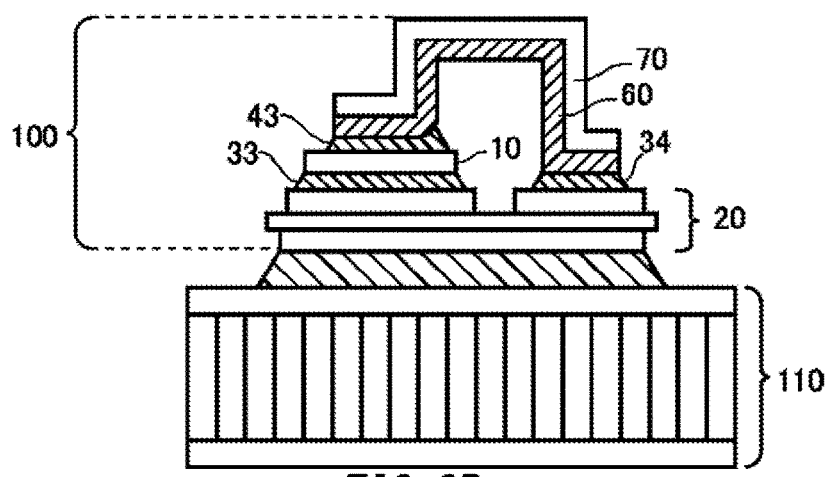
FIG. 9B

SEMICONDUCTOR MODULE AND MANUFACTURING METHOD THEREFOR

The contents of the following Japanese patent application(s) are incorporated herein by reference:
  NO. 2019-048215 filed in JP on Mar. 15, 2019, and
  NO. 2019-207470 filed in JP on Nov. 15, 2019.

BACKGROUND

1. Technical Field

The present invention relates to a semiconductor module and manufacturing method therefor.

2. Related Art

Conventionally, a structure has been known where a metal wiring plate is connected to an upper surface electrode of a semiconductor chip (for example, see Patent Document 1). The metal wiring plate has a plate-like bonding portion solder-bonded to the upper surface electrode and a rising portion provided in a manner extending upwardly from the bonding portion.

[Patent Document 1]: Japanese Patent Application Publication No. 2003-115512

SUMMARY

A semiconductor chip and a metal wiring plate are sealed by resin. When the temperature of the metal wiring plate changes, the rising portion of the metal wiring plate is prone to expand or contract in a vertical direction. Since the upper part of the rising portion is restrained by the sealing resin, the rising portion presses the upper surface electrode of the semiconductor chip. Therefore, the region of the upper surface electrode in the neighborhood of the rising portion will have greater strain than other regions of the upper surface electrode. Moreover, a crack may occur in the resin for sealing due to the thermal expansion of the metal wiring plate.

In an embodiment of the present invention, a semiconductor module is provided, which includes a semiconductor chip having an upper surface electrode and a lower surface electrode opposite to the upper surface electrode, a metal wring plate electrically connected to the upper surface electrode of the semiconductor chip, and a sheet-like low elastic sheet provided on the metal wiring plate, the low elastic sheet having an elastic modulus lower than the elastic modulus of the metal wiring plate. The sheet having the lower elastic modulus is referred to herein as the low elastic sheet as a convenient reference for the sheet having the lower elastic modulus. The sheet having the lower elastic modulus is also sometimes referred to herein as the low elastic modulus sheet.

The metal wiring plate may include a bonding portion for providing bonding to the upper surface electrode of the semiconductor chip and a rising portion connected to the bonding portion and extended in a direction away from the semiconductor chip.

The low elastic sheet may be provided on both of the bonding portion and the rising portion.

The low elastic sheet may be provided on the bonding portion but may not be provided on the rising portion.

The low elastic sheet may be provided to protrude out of an interface with the metal wiring plate at the end of the bonding portion.

The low elastic sheet may have an interface with the metal wiring plate at the end of the bonding portion, and the bonding portion may be solder-bonded to the upper surface electrode of said semiconductor chip.

The semiconductor module may be further provided with a solder portion for bonding the upper surface electrode of the semiconductor chip to the metal wiring plate, and a sealing resin for sealing the semiconductor chip and the metal wiring plate. The sealing resin may be in contact with the solder portion.

The sealing resin may be in contact with a side surface of the bonding portion of the metal wiring plate.

The elastic modulus of the low elastic sheet may be lower than the elastic modulus of the sealing resin.

The elastic modulus of the low elastic sheet may be $1/10000$ of the elastic modulus of the sealing resin or higher, and $1/10$ of the elastic modulus of the sealing resin or lower.

The low elastic sheet may have an elastic modulus of 1 MPa or higher and 1000 MPa or lower.

The low elastic sheet may have a thickness of 0.05 mm or more and 1.5 mm or less.

The low elastic sheet may include any one of foam, resin and silicone rubber.

In an embodiment of the present invention, a manufacturing method for a semiconductor module is provided, comprising: providing a semiconductor chip; solder-bonding a metal wiring plate above said semiconductor chip; and applying a sheet-like low elastic sheet having the elastic modulus lower than that of said metal wiring plate to said metal wiring plate.

After applying a sheet-like low elastic sheet to a metal wiring plate, the metal wiring plate may be solder-bonded above the semiconductor chip.

After solder-bonding a metal wiring plate above the semiconductor chip, the low elastic sheet may be applied to the metal wiring plate.

The summary clause does not necessarily describe all necessary features of the examples of the present invention. The present invention may also be a sub-combination of the features described above.

BRIEF DESCRIPTION OF THE DRAWINGS

FIG. 1A is a top view of a semiconductor module 300 according to a working example 1.

FIG. 4 is an example of a cross-sectional view of a semiconductor module 500 according to a comparative example.

FIG. 9B shows an example of a manufacturing method for the semiconductor module 300.

DESCRIPTION OF EXEMPLARY EMBODIMENTS

While the present inventions are described through the embodiments, the embodiments below do not limit to the inventions according to the scope of claims. In addition, not all the combination of the features explained in the embodiments are necessarily essential for the problems to be solved by the invention.

Figure 1B:
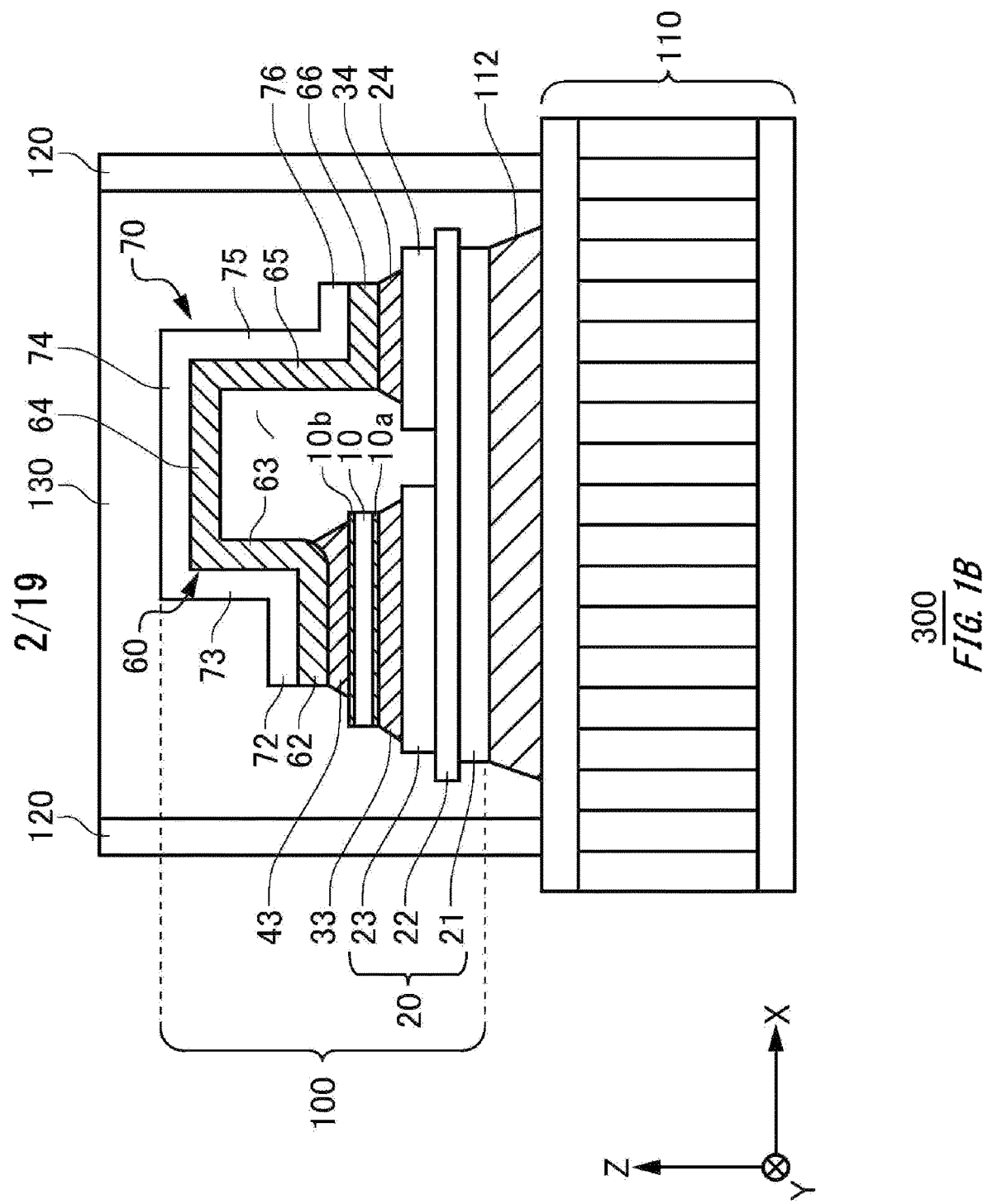
FIG. 1B is a cross-sectional view taken along line A-A in FIG. 1A.

FIG. 1A is a top view of the semiconductor module 300 according to the working example 1. FIG. 1B is a cross-sectional view taken along line A-A in FIG. 1A. The semiconductor module 300 according to the present example includes a semiconductor assembly 100, a cooling portion 110, a case 120 and a sealing resin 130.

In this specification, a side in a direction of the thickness of the semiconductor assembly 100 is referred to as "upper", "above", "on" or other similar words, and the other side is referred to as "lower", "under" or other similar words. Of two main surfaces of an element, a substrate, a layer, a film or other member, one surface is referred to as "upper surface", and the other surface is referred to as "lower surface". An "upper" or "lower" direction is not limited to the gravity direction. In the present example, a vertical direction is referred to as "Z-axis direction", and two directions orthogonally crossing in a surface vertical to the Z-axis direction are referred to as "X-axis direction" and "Y-axis direction". The XYZ axes constitute a right-handed coordinate system.

A semiconductor assembly 100 is an assembly having a semiconductor chip 10, a multilayered substrate 20, a metal wiring plate 60 and a low elastic sheet 70. The semiconductor assembly 100 is solder-bonded onto the cooling portion 110 using a solder-bonding portion 112. It should be noted that the semiconductor assembly 100 may be placed on a metal base plate.

The cooling portion 110 dissipates heat generated by the semiconductor chip 10 and the others to the outside. The cooling portion 110 is formed of a material having high thermal conductivity, such as an aluminum. The cooling portion 110 may include a top plate and a bottom plate facing the top plate. In the cooling portion 110, a plurality of fins may be formed between the top plate and the bottom plate to have a larger heat dissipation area. The semiconductor assembly 100 according to the present example is thermally and mechanically fixed to the cooling portion 110 via the solder portion 112. For example, the solder portion 112 is a solder of an Sn—Sb base or of an Sb—Ag base.

The case 120 is provided on the top surface of the cooling portion 100 in a manner that it surrounds the semiconductor assembly 100. The shape of the case 120 of the present example is rectangular, however, the shape should not be limited to this. For example, the material of the case 120 is an insulating material such as resin. The resin may be selected from, for example, polyphenylene sulfide (PPS), polybutylene terephthalate (PBT), polybutyl acrylate (PBA), polyamide (PA), acrylonitrile butadiene styrene (ABS), liquid crystal polymer (LCP), polyether ether ketone (PEEK), polybutylene succinate (PBS), an urethane or a silicone.

The sealing resin 130 seals the inside of the case 120. The sealing resin 130 covers the entire semiconductor assembly 100. Namely, the sealing resin 130 seals the semiconductor chip 10, the multilayered substrate 20, the metal wiring plate 60, the solder portions 33, 34, 43 and the low elastic sheet 70. For example, the material of the sealing resin 130 is an epoxy resin.

The semiconductor chip 10 is a semiconductor chip formed of a semiconductor substrate such as a silicon substrate. In an example, the semiconductor chip 10 includes a switching device such as an insulated gate bipolar transistor (IGBT) or a power MOSFET. The semiconductor chip 10 may include an RC-IGBT (Reverse-Conducting IGBT) including a free wheel diode (FWD). The semiconductor chip 10 may include a vertical switching device. In the semiconductor chip 10, an upper surface electrode and a lower surface electrode may be formed. The upper surface electrode and the lower surface electrode may be electrically connected to a negative potential and to a positive potential, respectively.

The multilayered substrate 20 is provided on the upper surface of the cooling portion 110. The multilayered substrate 20 has a metal plate 21, an insulating plate 21, a circuit portion 23 and a circuit portion 24. For example, the multilayered substrate 20 may be a DCB (Direct Copper Bonding) substrate or an AMB (Active Metal Brazing) substrate.

The insulating plate 22 is formed of an insulating material, for example, ceramics such as alumina ($Al_2O_3$), aluminum nitride (AlN), and silicon nitride ($Si_3N_4$). The metal plate 21 is provided on a lower surface of the insulating plate 22. The circuit portion 23 and the circuit portion 24 are provided on an upper surface of the insulating plate 22. The metal plate 21, the circuit portion 23 and the circuit portion 24 may be formed of plates containing a metal material such as copper or a copper alloy. The metal plate 21, the circuit portion 23 and the circuit portion 24 may be fixed to a surface of the insulating plate 22 via soldering, brazing or the like.

The circuit portion 23 is solder-bonded to the semiconductor chip 10 using the solder portion 33. Accordingly, the circuit portion 23 is electrically connected to the semiconductor chip 10.

The circuit portion 24 is solder-bonded to the metal wiring plate 60. The circuit portion 24 is not solder-bonded to the semiconductor chip 10. However, the circuit portion 24 may be solder-bonded to a semiconductor 10 which is not the semiconductor 10 solder-bonded to the circuit portion 23. The circuit portion 23 and the circuit portion 24 may each include a metal wiring, a pad or the like formed on the top surface of the insulating plate 22, and also may include a signal processing circuit or the like.

The solder portion 33 fixes the semiconductor chip 10 to the circuit portion 23. The solder portion 33 electrically and mechanically connects the semiconductor chip 10 with the circuit portion 23. For example, the solder portion 33 connects the pad included in the circuit portion 23 to the lower surface electrode 10a of the semiconductor chip 10. For example, the material of the solder portion 33 is a solder of an Sn—Cu base or an Sn—Sb base. The solder portion 33 has two surfaces that contact the semiconductor 10 to the circuit portion 23, and has side surfaces that connect said two surfaces, and said side surfaces are in contact with the sealing resin 130.

The metal wiring plate 60 is an electric wiring for the semiconductor chip 10 electrically connected to the semiconductor chip 10. The metal wiring plate 60 of the present example electrically connects the semiconductor chip 10 to the circuit portion 24. One end portion of the metal wiring plate 60 is connected to the upper surface electrode of the semiconductor chip 10, and the other end portion of the metal wiring plate 60 is connected to the upper surface of the circuit portion 24.

For example, the material of the metal wiring plate 60 is copper, a copper alloy, aluminum, an aluminum alloy or the like. In an example, the thickness of the metal wiring plate 60 is 0.5 mm or more, and 1.0 mm or less. The metal wiring plate 60 of the present example includes a bonding portion 62, a rising portion 63, a connecting portion 64, a rising portion 65 and a bonding portion 66.

The bonding portion 62 is solder-bonded to an upper surface electrode 10b of a semiconductor chip 10 using a solder portion 43. Accordingly, the bonding portion 62 is fixed onto the semiconductor chip 10, and is electrically connected to the semiconductor chip 10. For example, the solder portion 43 is a solder of an Sn—Cu base or an Sn—Sb base.

The rising portion 63 is connected to the bonding portion 62. The rising portion 63 extends in a direction away from the upper surface of the semiconductor chip 10 from the bonding portion 62. In other words, the rising portion 63 is a portion bent at an any angle relative to the bonding portion 62. The rising portion 63 of the present example extends in a direction perpendicular to the upper surface of the semiconductor chip 10 (namely, in the Z-axis direction).

The bonding portion 66 is solder-bonded to the upper surface of the circuit portion 24 via the solder portion 34. Accordingly, the bonding portion 66 is fixed onto the circuit portion 24, and is electrically connected to the circuit portion 24. For example, the solder portion is 34 is a solder of an Sn—Cu base or an Sn—Sb base. The bonding portion 66 is connected to the rising portion 63 via the bonding portion 64.

The rising portion 65 is connected to the bonding portion 66. The rising portion 65 extends in a direction away from the upper surface of the circuit portion 24 from the bonding portion 66. In other words, the rising portion 65 is a portion bent in an any angle relative to the bonding portion 66. The rising portion 65 of the present example extends in a direction perpendicular to the upper surface of the circuit portion 24 (namely, in the Z-axis direction). The bonding portion 62 and the bonding portion 66 may be provided away from each other in the Z-axis direction. In the Z-axis direction, the length of the rising portion 63 may be set shorter than the length of the rising portion 65, for example, shorter by the thickness of the semiconductor chip 10 plus the solder portion 43.

The low elastic sheet 70 is provided on the metal wiring plate 60. The low elastic sheet 70 is a sheet-like member having an elastic modulus lower than the elastic modulus of the metal wiring plate 60. In the present example, "sheet-like" means that the low elastic sheet 70 has substantially uniform thickness also at its end portion. On the other hand, if a low elastic layer is formed by liquid application, the film thickness will not be uniform between its center and its end portion.

The low elastic sheet 70 has a bonding portion 72, a rising portion 73, a connecting portion 74, a rising portion 75 and a bonding portion 76. The bonding portion 72 is provided on the upper surface of the bonding portion 62. The rising portion 73 is provided facing the rising portion 63. The connecting portion 74 is provided on the connecting portion 64. The rising portion 75 is provided facing the rising portion 65. The bonding portion 76 is provided on the connecting portion 66. In the present example, a piece of sheet serving as the low elastic sheet 70 is applied onto the metal wiring plate 60. The low elastic sheet 70 may be applied to the metal wiring plate 60 with an adhesive. The bonding portion 72 and the bonding portion 76 have substantially uniform film thickness. For example, variation of the film thickness between the bonding portion 72 and the bonding portion 76 is within ±10%. It should be noted that the bonding portion 72, the rising portion 73, the connecting portion 74, the rising portion 75 and the bonding portion 76 may be applied to the metal wiring plate 60, with the portions being spaced apart from each other.

The elastic modulus of the low elastic sheet 70 is lower than the elastic modulus of the sealing resin 130. In an example, the elastic modulus of the low elastic sheet 70 may be 1/10 of the elastic modulus of the sealing resin 130 or lower, or 1/100 of the elastic modulus of the sealing resin 130 or lower. The elastic modulus of the low elastic sheet 70 in the present example is 1/10000 of the elastic modulus of the sealing resin 130 or higher, and 1/10 of the elastic modulus of the sealing resin 130 or lower. However, the elastic modulus of the low elastic sheet 70 may be 1/1000 of the elastic modulus of the sealing resin 130 or higher. The low elastic sheet 70 is provided between the metal wiring plate 60 and the sealing resin 130. Accordingly, the low elastic sheet 70 can suppress cracks, such as electrode crack and resin crack occurring due to a thermal stress.

The low elastic sheet 70 is provided on the entire upper surface of the metal wiring plate 60. However, the low elastic sheet 70 may be provided on only a part of the metal wiring plate 60. The low elastic sheet 70 of the present example is provided on both the bonding portion and the rising portion. "On the rising portion" in the present example means a case where the low elastic sheet 70 is provided in contact with the rising portion, and is not necessarily limited to cases where it is provided on the upper surface in a gravity direction. It should be noted that the low elastic sheet 70 is provided to be spaced apart from the semiconductor chip 10 and being spaced apart from the solder portion. Namely, when the solder portion and the sealing resin 130 contact each other, the solder portion is firmly fixed, so that occurrence of solder crack can be suppressed.

The film thickness of the low elastic sheet 70 may be designed appropriately in accordance with the configuration, etc., of the semiconductor module 300. In an example, the film thickness of the low elastic sheet 70 is 0.05 mm or more, and 1.5 mm or less. The film thickness of the low elastic sheet 70 may be 0.1 mm or more, and also may be 0.3 mm or more. The film thickness of the low elastic sheet 70 may be 1.0 mm or less. For example, the material of the low elastic sheet 70 contains any one of foam, resin or silicone rubber. More concretely, the material of the low elastic sheet 70 may be polyimide foam or epoxy resin. It should be noted that the thermal conductivity and the electrical conductivity of the low elastic sheet 70 are not particularly limited.

The low elastic sheet 70 has an interface with the metal wiring plate 60 at the end portion of the bonding portion 62. The position of the end portion of the bonding portion 62 is not particularly limited. The end portion of the bonding portion 62 may be an end portion of the bonding portion 62 that is opposite to the rising portion 63. Since the bonding portion 62 is solder-bonded to the semiconductor chip 10, thermal expansion occurs in the bonding portion 62 and the rising portion 63. Then, at the end portion of the bonding portion 62 opposite to the rising portion 63, stresses due to thermal expansion of the bonding portion 62 and the rising portion 63 are likely to be concentrated. By providing the low elastic sheet 70 in the region where stresses are likely to be concentrated, occurrence of resin cracks can be suppressed.

Figure 2A:
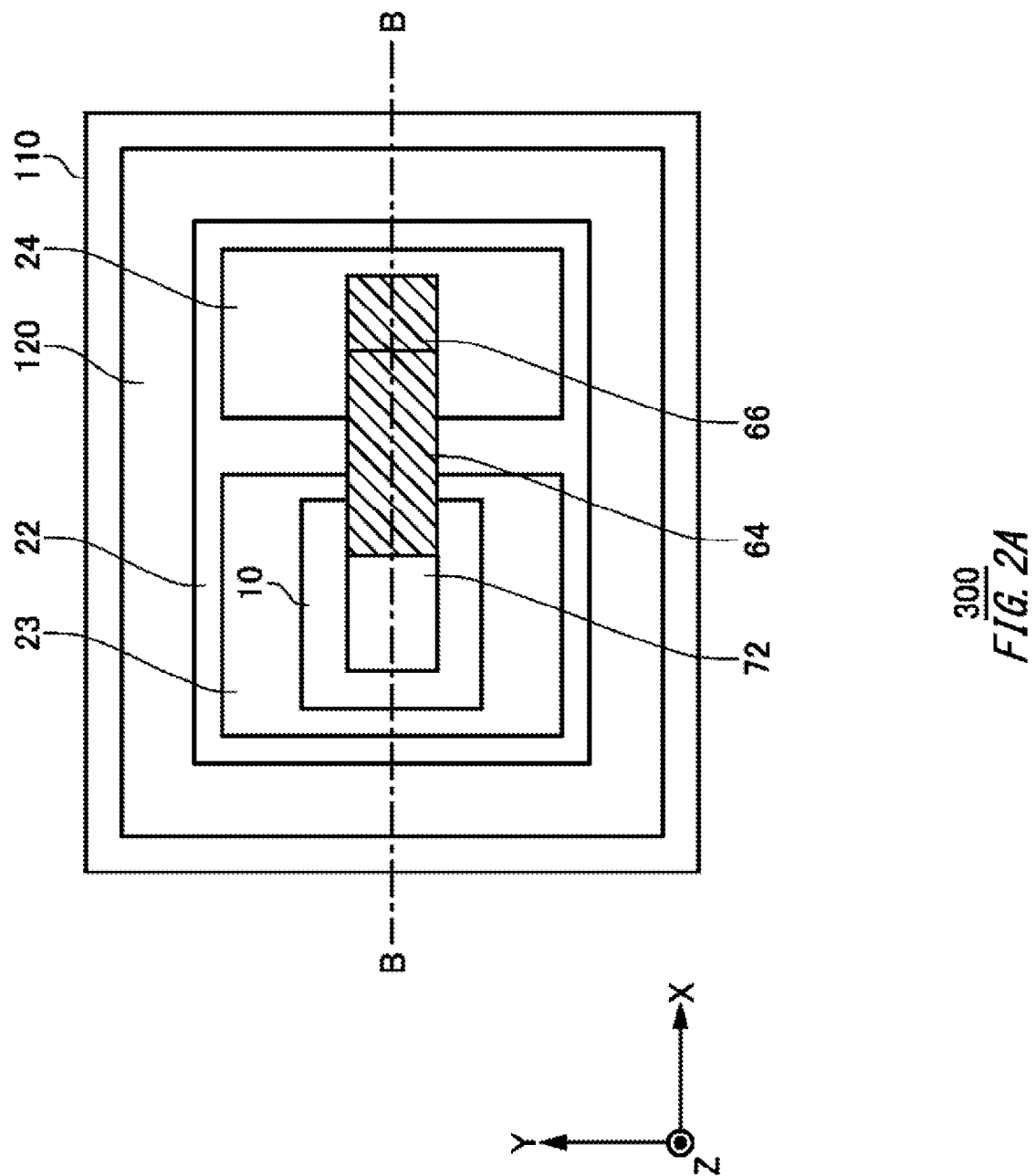
FIG. 2A is a top view of the semiconductor module 300 according to a working example 2.
Figure 2B:
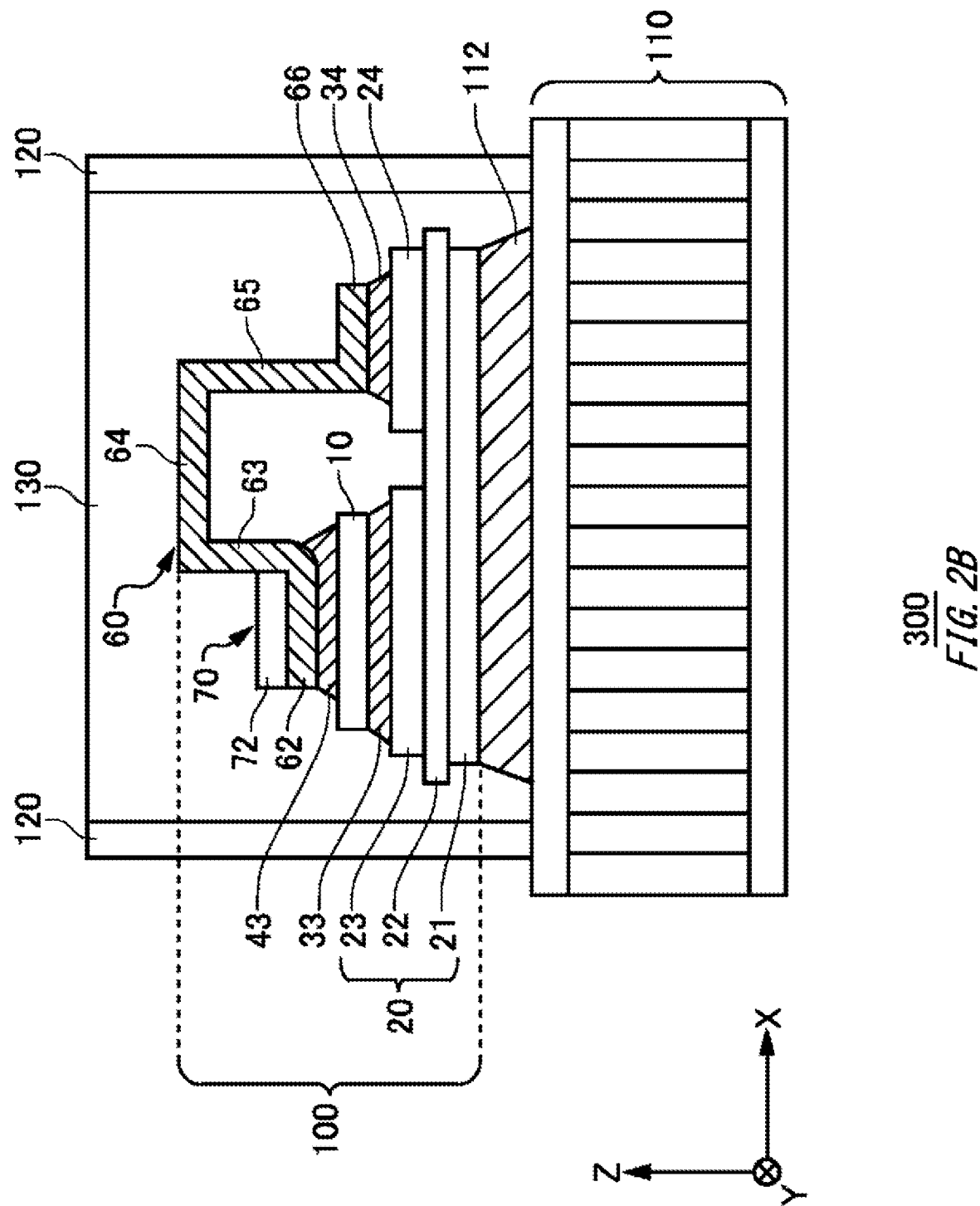
FIG. 2B is a cross-sectional view of FIG. 2A taken along line B-B in FIG. 2A.

FIG. 2A is a top view of a semiconductor module 300 according to the working example 2. FIG. 2B is a cross-sectional view taken along line B-B in FIG. 2A. The semiconductor module 300 of the present example has a low elastic sheet 70 on a bonding portion 62. In the description of the present example, differences between the present example and the working example 1 are particularly explained.

The low elastic sheet 70 is provided on the bonding portion 62. On the other hand, the low elastic sheet 70 of the present example is not provided on the rising portion 63, the connecting portion 64, the rising portion 65 and the bonding portion 66. By providing the low elastic sheet 70 in the neighborhood of a region where the semiconductor chip 10 is provided, occurrence of resin cracks can be suppressed, which are caused by thermal stress due to heat generated by the semiconductor chip 10.

In the semiconductor module 300 of the present example, the low elastic sheet 70 is provided only on the bonding portion 62, eliminating need to apply the low elastic sheet 70 along the shape of the metal wiring plate 60. Therefore, even if the configuration of the metal wiring plate 60 is complex, the low elastic sheet 70 can be easily applied.

Figure 3A:
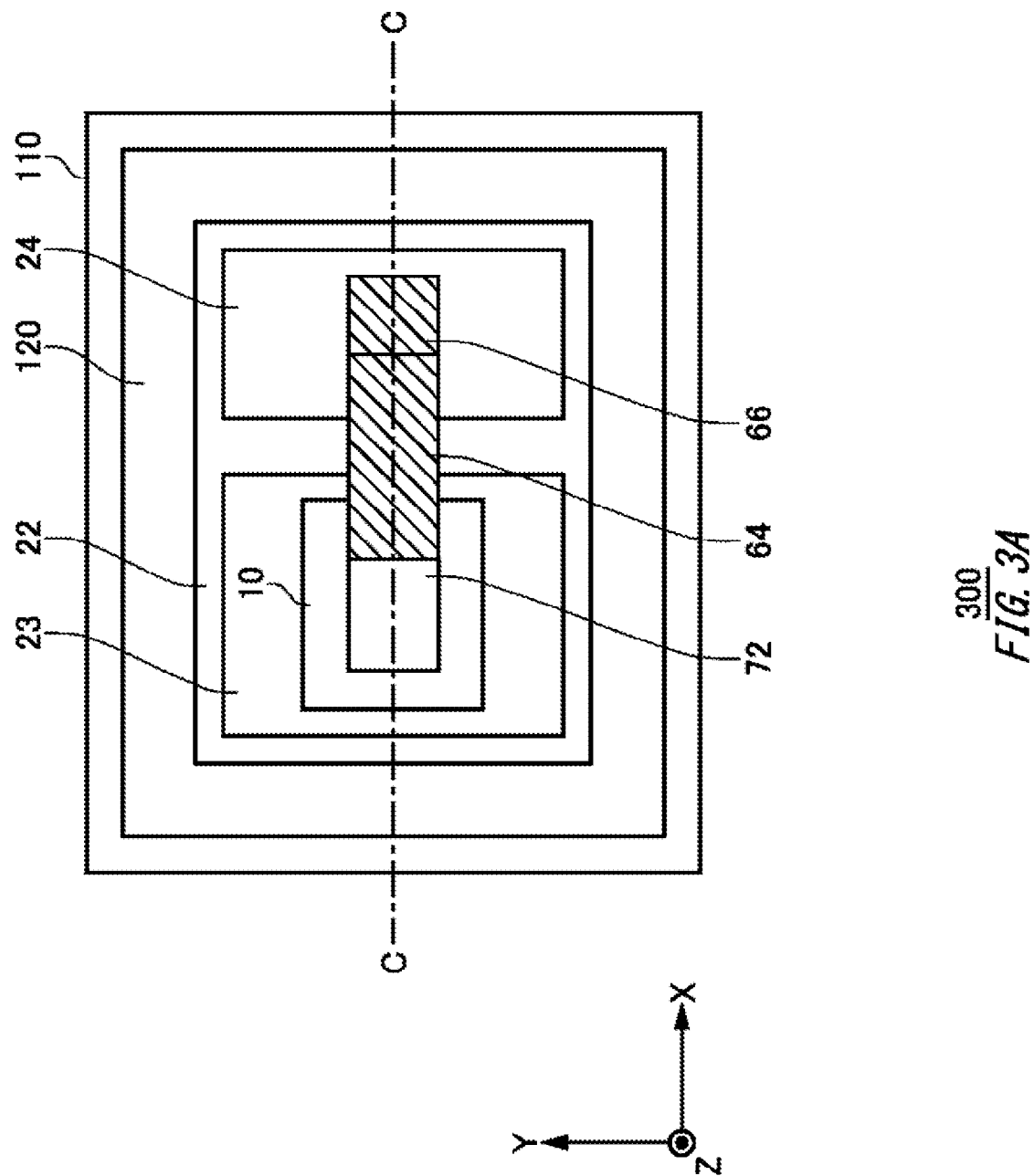
FIG. 3A is a top view of the semiconductor module 300 according to a working example 3.
Figure 3B:
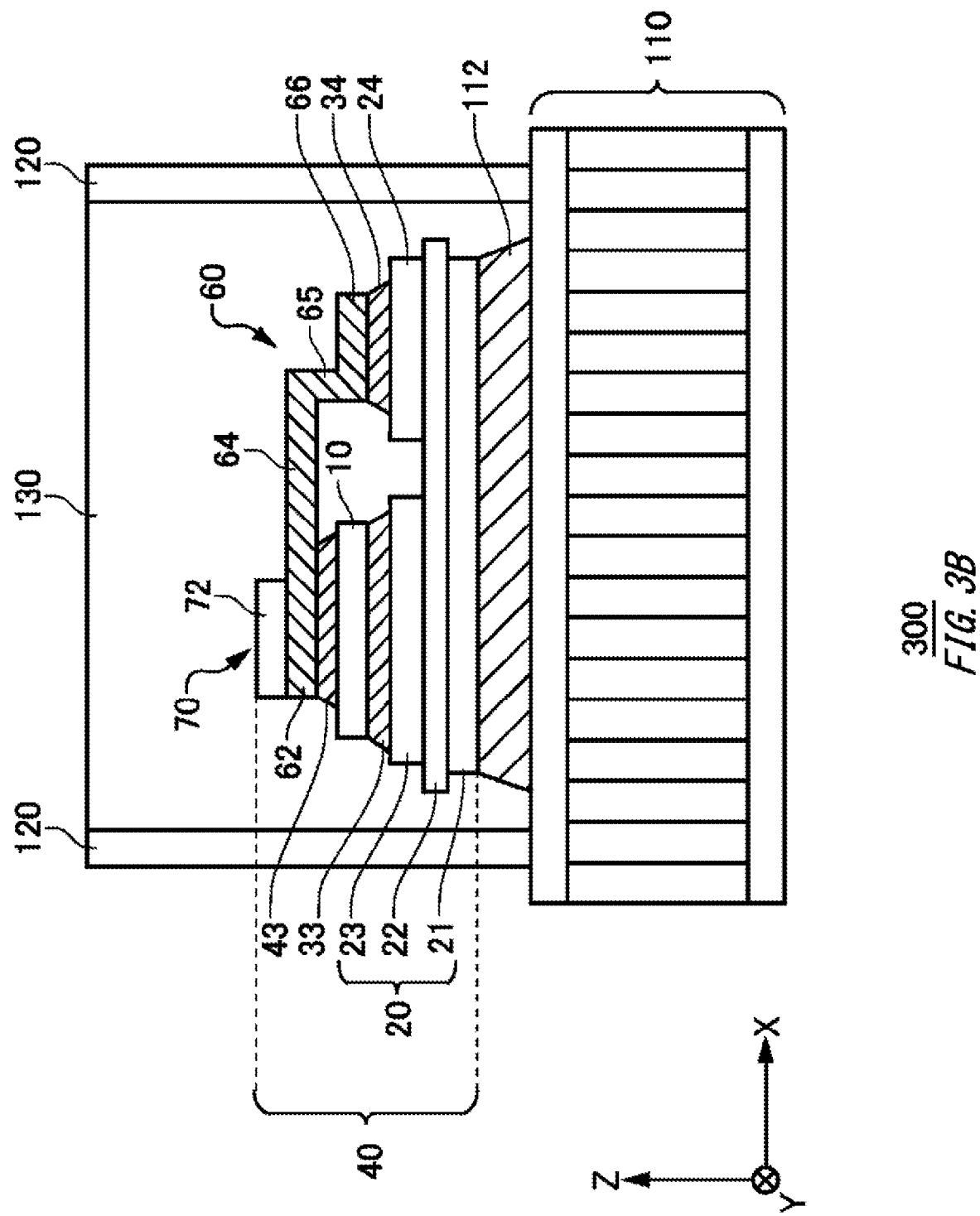
FIG. 3B is a cross-sectional view taken along line C-C in FIG. 3A.

FIG. 3A is a top view of the semiconductor module 300 according to a working example 3. FIG. 3B is a cross-sectional view taken along line C-C in FIG. 3A. The semiconductor module 300 of the present example has a metal wiring plate 60 having different shape from that in the working example 2. In the description of the present example, differences between the present example and the working example 2 are particularly explained.

The metal wiring plate 60 has the bonding portion 62, the connecting portion 64, the rising portion 65 and the bonding portion 66. Namely, the metal wiring plate 60 of the present example differs from the metal wiring plate 60 in the working example 2, in that the metal wiring plate 60 of the present example does not have the rising portion 63. In this way, the shape of the metal wiring plate 60 may be changed appropriately in accordance with the configuration, etc., of the semiconductor module 300.

The low elastic sheet 70 is provided on the bonding portion 62. The low elastic sheet 70 is not provided on the connecting portion 64, the rising portion 65 and the bonding portion 66. However, the low elastic sheet 70 may be provided on the upper surfaces of the connecting portion 64, the rising portion 65 and the bonding portion 66. In this way, it is preferable that the low elastic sheet 70 be provided on the bonding portion 62 solder-bonded to the semiconductor chip 10, even if the shape of the metal wiring plate 60 is changed. Accordingly, effect of the thermal expansion of the metal wiring plate 60 is reduced.

FIG. 4 is an example of a cross-sectional view of a semiconductor module 500 according to the comparative example. The semiconductor module 500 differs from the semiconductor module 300 according to the working examples, in that the semiconductor module 500 is not provided with a low elastic sheet 70. The semiconductor module 500 has a case 520, a sealing resin 530, a semiconductor assembly 540 and a cooling portion 550. The semiconductor assembly 540 has a semiconductor chip 510 and a metal wiring plate 560 placed on a multilayered substrate 525.

The metal wiring plate 560 is provided above the semiconductor chip 510 via a solder portion 543. However, on the metal wiring plate 560, a low elastic sheet 70 is not provided. As such, the metal wiring plate 560 is directly covered by the sealing resin 530. The metal wiring plate 560 has the rising portion 563 above the semiconductor chip 510.

Here, reliability of the semiconductor 300 is tested through a power cycle test such as the ΔTj power cycle. For example, in the ΔTj power cycle test, two failure modes, namely the electrode crack and the resin crack are assessed.

The electrode crack is a failure mode in which a crack occurs in the semiconductor chip 10, the start point of the crack being at the upper surface electrode of the semiconductor chip 10. The fracture life can be estimated based on the plastic strain amplitude in a thermal stress simulation. The semiconductor chip 10 will have longer lifetime, if the plastic strain amplitude are smaller. The plastic strain amplitude means the difference between the plastic strain occurring in the upper surface electrode when heated and the plastic strain occurring in the upper surface electrode when cooled. Right below the rising portion of the metal wiring plate 560, the strain will be greater. This is because the metal wiring plate 560 is prone to extend due to thermal expansion, while restrained by the sealing resin 530, resulting in the stress due to thermal expansion toward the semiconductor chip 10.

The resin crack is a failure mode in which a crack occurs in the sealing resin 530. Portion broken due to the resin crack can be estimated from the distribution of stress generation in the thermal stress simulation. The portion subjected to a high stress is the edge portion of the metal wiring plate 560 (namely, the edge portion of the portion bonded to the semiconductor chip 510), which is supposed to be the start point of the crack. This is because the metal wiring plate 560 thermally expands horizontally due to heat generation of the semiconductor chip 510, while the periphery is sealed by the sealing resin 530, accordingly the extension of the metal wiring plate 560 concentrates on the side surface 567 of the edge portion.

Providing the low elastic sheet 70 in the semiconductor assembly 100 can reduce the stress toward the semiconductor chip 10 and the stress concentration on the sealing resin 130. For example, as to the stress toward the semiconductor chip 10, when the film thickness of the low elastic sheet 70 is thickened, it is possible to further mitigate the stress toward the semiconductor 10. By lowering the elastic modulus of and thickening the film thickness of the low elastic sheet 70, the cushioning effect for reducing the stress applied to the semiconductor chip 100 is enhanced. Accordingly, electrode cracks can be easily suppressed.

Moreover, as for concentration of the stress on the sealing resin 130, thanks to the cushioning effect of the low elastic sheet 70, the deformation in a vertical direction becomes possible, so that concentration of the stress in the horizontal direction of the metal wiring plate 560 due to thermal expansion can be reduced. Accordingly, resin crack can be easily suppressed. In this way, providing the low elastic sheet 70 in the semiconductor assembly 100 can suppress electrode crack and resin crack during the ΔTj power cycle.

Figure 5A:
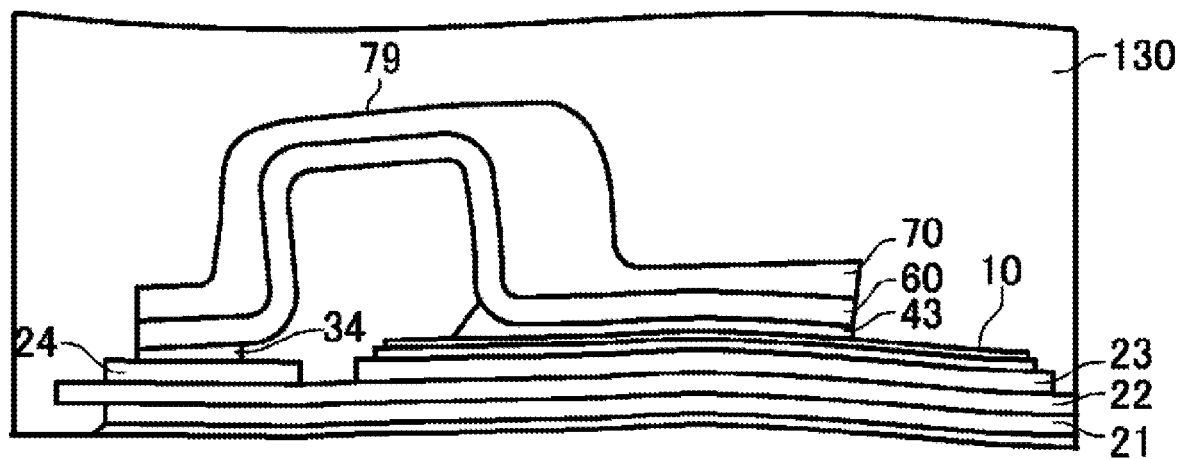
FIG. 5A is an example of a cross-sectional view after a stress is generated in the semiconductor module 300 according to the working example 1.

FIG. 5A is an example of a cross-sectional view after stress is generated in the semiconductor module 300, according to the working example 1. The shape of the low elastic sheet 70 is largely deformed due to the stress generated in the semiconductor module 300. For example, the upper surface 79 of the low elastic sheet 70 is largely collapsed, and displaced laterally. In addition, the upper surface of the sealing resin 130 is also largely deformed. In this way, in the semiconductor module 300, concentration of the stress in the neighborhood of the metal wiring plate 60 can be mitigated through deformation of the low elastic sheet 70. FIG. 5A is an emphasized view for explanation, and concrete forms of deformation are not limited to the present example.

Figure 5B:
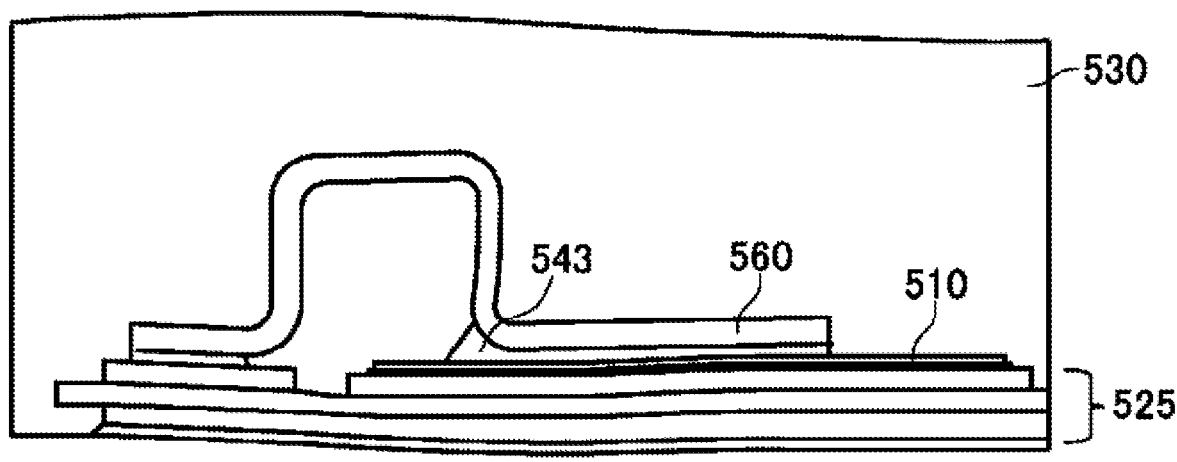
FIG. 5B is an example of a cross-sectional view after a stress is generated in the semiconductor module 500 according to the comparative example.

FIG. 5B is an example of a cross-sectional view after stress is generated in the semiconductor module 500 according to the comparative example. The semiconductor module 500 according to the present example does not have the low elastic sheet 70 on the upper surface of the metal wiring plate 560. Therefore, the sealing resin 530 is not deformed and accordingly a large stress is generated on the interface between the sealing resin 530 and the metal wiring plate 560. Particularly, a large stress is generated around the semiconductor chip 510 which generates heat.

Figure 6A:
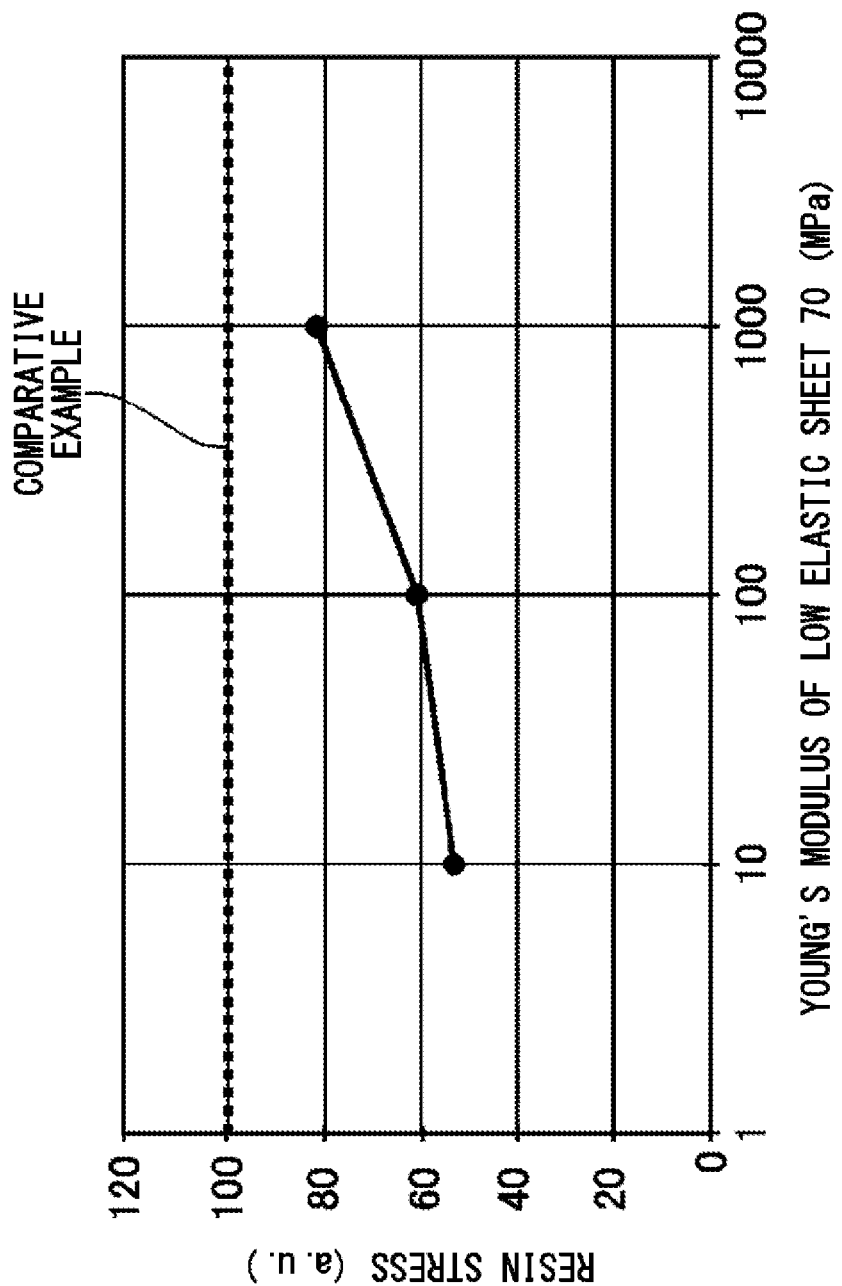
FIG. 6A is a chart showing the relation between the resin stress and the Young's modulus of a low elastic sheet 70.

FIG. 6A is a chart showing the relation between the resin stress and the Young's modulus of the low elastic sheet 70. The vertical axis indicates the values of the resin stresses (MPa) generated in the sealing resin 130, which are scaled to arbitrary units (a.u.), and the horizontal axis indicates the Young's modulus (MPa). The solid line indicates the result of the simulation of the semiconductor module 300 according to the working example. The broken line indicates the result of the simulation of the semiconductor module 500 according to the comparative example. In the present example, the comparative example is indicated as 100 (a.u.).

For the working example, the results of the simulations for the three Young Moduli, i.e. 10 MPa, 100 MPa and 1000 MPa, of the low elastic sheets 70 are shown. The resin stresses of the working example were lower than the resin stress of the comparative example in all the cases. This means that, in the semiconductor module 300, stress generated in the sealing resin 130 can be reduced by applying the low elastic sheet 70. Also, stress generated in the sealing resin 130 becomes lower as the Young's modulus of the low elastic sheet 70 decreases.

Figure 6B:
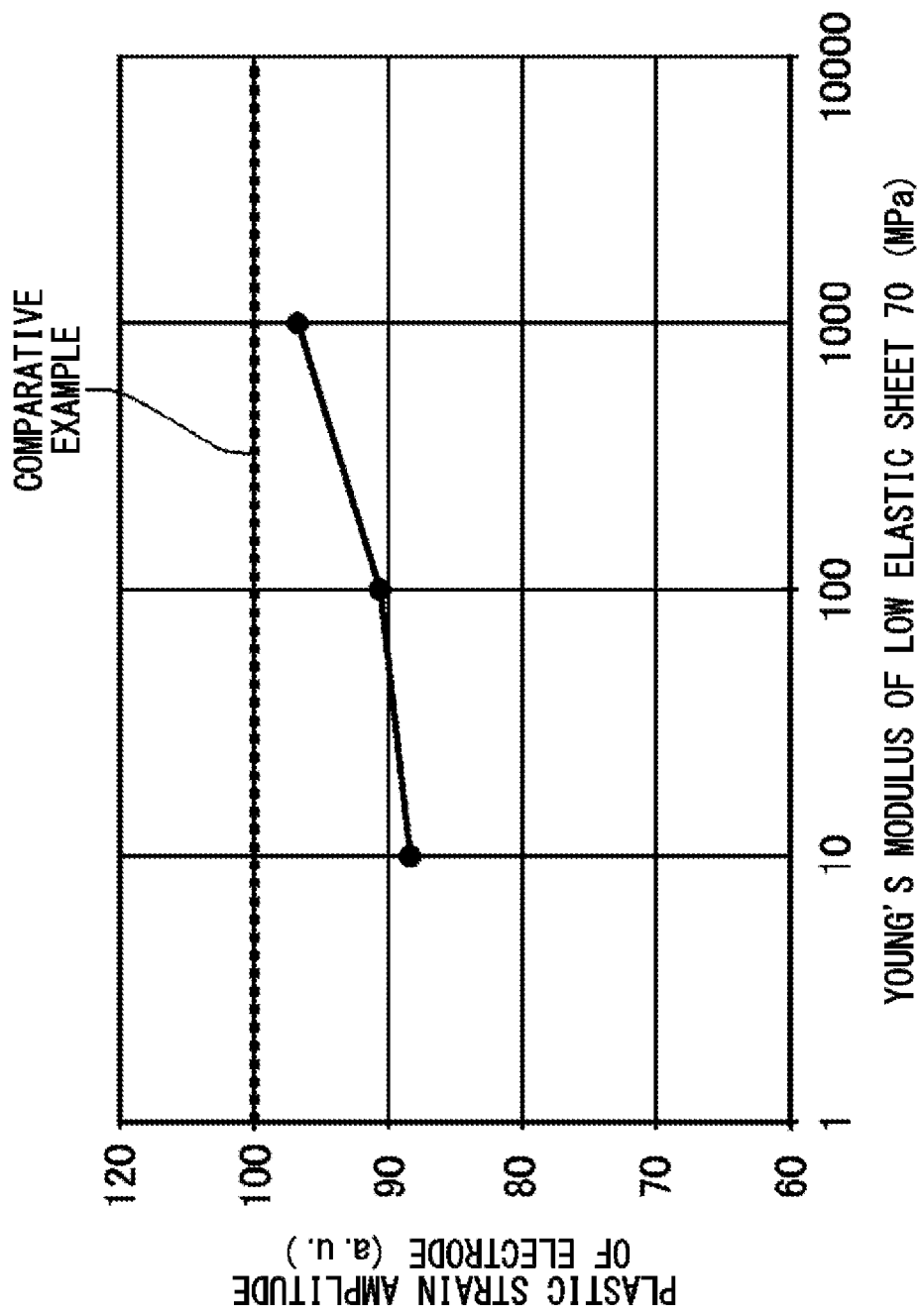
FIG. 6B is a chart showing the relation between the plastic strain amplitude and the Young's modulus of the low elastic sheet 70.

FIG. 6B is a chart showing the relation between the plastic strain amplitude generated in the upper surface electrode and the Young's modulus of the low elastic sheet 70. The vertical axis indicates the values of the plastic strain amplitude (%) of the electrodes, which are scaled to arbitrary units (a.u.), and the horizontal axis indicates the Young's modulus (MPa). The upper surface electrode of the present example means the electrode of Al—Si or the like, which is provided on the upper surface of the semiconductor chip 10. The solid line indicates the result of the simulation of the semiconductor module 300 according to the working example. The broken line indicates the result of the simulation of the semiconductor module 500 according to the comparative example. In this example, the comparative example is indicated as 100 (a.u.).

In the working example, the results of the simulations for the three Young Moduli, i.e. 10 MPa, 100 MPa and 1000 MPa, of the low elastic sheet 70 is shown. The plastic strain amplitude of the electrodes according to the working example were lower than the plastic strain amplitude according to the comparative example in all the cases. This means that, in the semiconductor module 300, the plastic strain amplitude of the electrodes can be reduced by applying the low elastic sheet 70. Also, the plastic strain amplitude of the electrodes are smaller as the Young's modulus of the low elastic sheet 70 becomes lower.

Figure 7A:
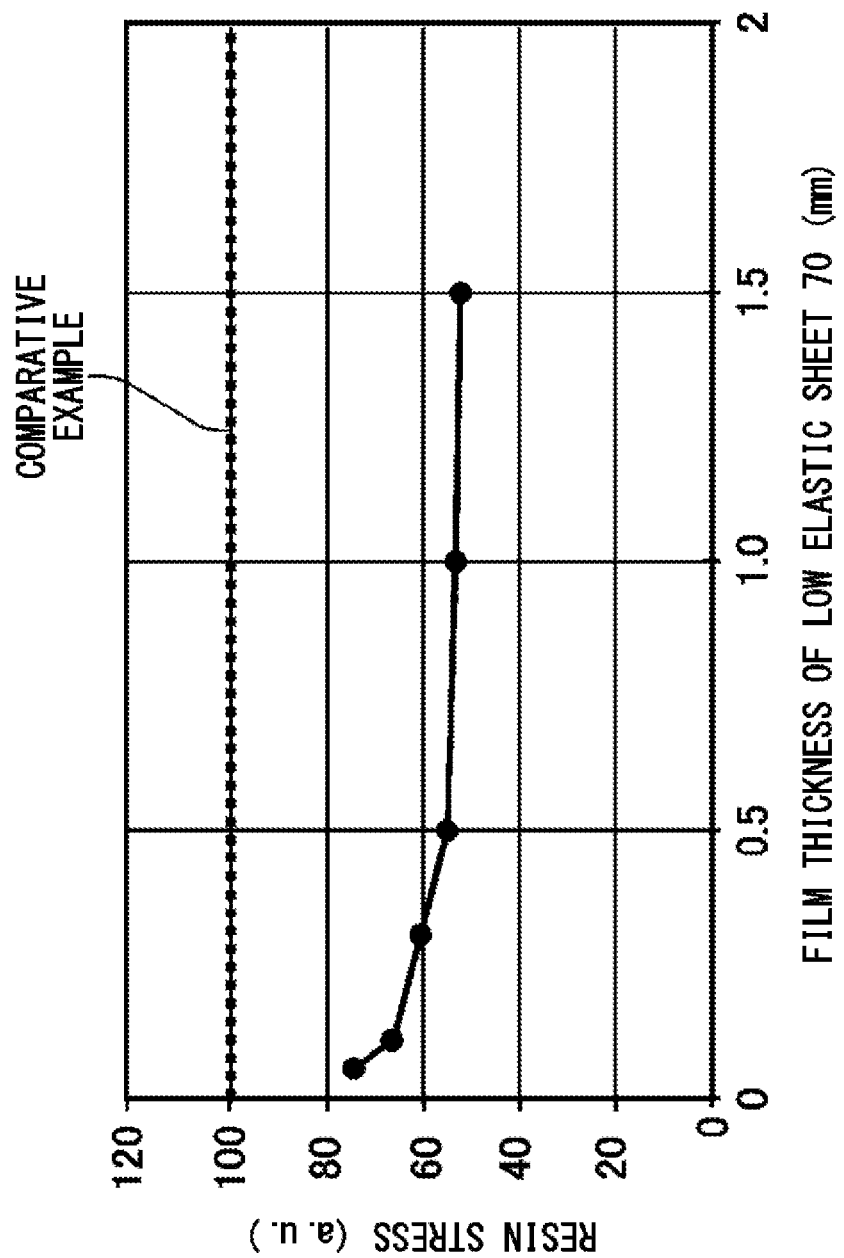
FIG. 7A is a chart showing the relation between the resin stress and the film thickness of the low elastic sheet 70.

FIG. 7A is a chart showing the relation between the resin stress and the film thickness of the low elastic sheet 70. The vertical axis indicates the values of resin stresses (MPa) generated in the sealing resin 130, which are scaled to arbitrary units (a.u.), and the horizontal axis indicates the film thickness (mm) of the low elastic sheet 70. The solid line indicates the result of the simulation of the semiconductor module 300 according to the working example. The broken line indicates the result of the simulation of the semiconductor module 500 according to the comparative example. In this example, the comparative example is indicated as 100 (a.u.).

In the working example, the result of the simulation with six kinds of the film thickness, i.e. 0.05 mm, 0.1 mm, 0.3 mm, 0.5 mm and 1.0 mm, of the low elastic sheet 70 is shown. The resin stresses in the working example were lower than the resin stress of the comparative example in all the cases. This means that, in the semiconductor module 300, stress generated in the sealing resin 130 can be reduced by applying the low elastic sheet 70.

Figure 7B:
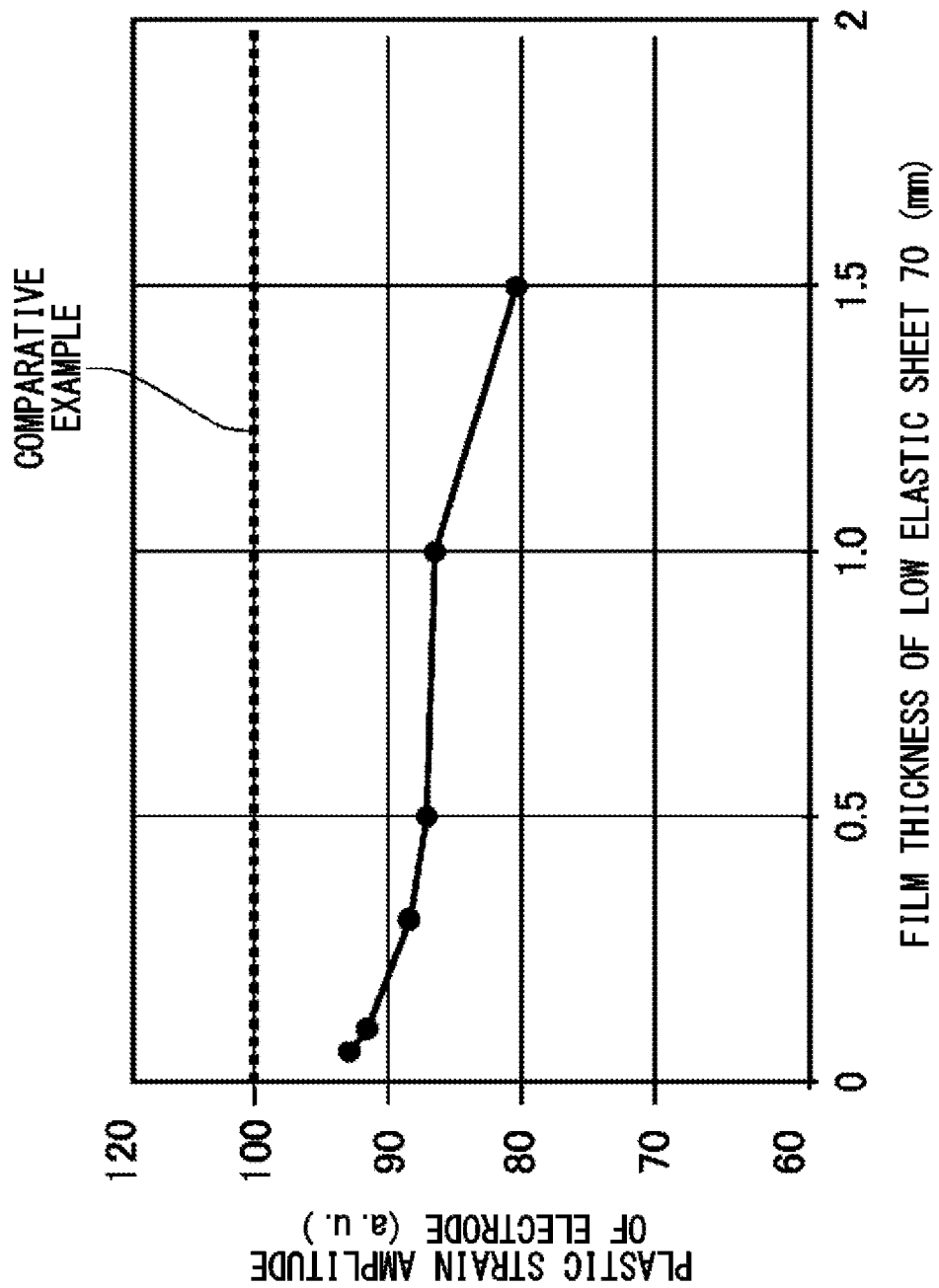
FIG. 7B is a chart showing the relation between the plastic strain amplitude and the film thickness of the low elastic sheet 70.

FIG. 7B is a chart showing the relation between the plastic strain amplitude and the film thickness of the low elastic sheet 70. The vertical axis indicates the values of plastic strain amplitude (%) of the electrodes, which are scaled to arbitrary units (a.u.), and the horizontal axis indicates the film thickness (mm) of the low elastic sheet 70. The solid line indicates the result of the simulation of the semiconductor module 300 according to the working example. The broken line indicates the result of the simulation of the semiconductor module 500 according to the comparative example. In the present example, the comparative example is indicated as 100 (a.u.).

In the working example, the result of the simulation with six kinds of the film thickness, i.e. 0.05 mm, 0.1 mm, 0.3 mm, 0.5 mm and 1.0 mm, of the low elastic sheet 70 is shown. The plastic strain amplitude of the electrodes according to the working example were lower than the plastic strain amplitude according to the comparative example in all the cases. This means that, in the semiconductor module 300, plastic strain amplitude of the electrodes can be reduced by applying the low elastic sheet 70. Also, plastic strain amplitude of the electrodes are smaller as the film thickness of the low elastic sheet 70 becomes thicker.

Figure 8:
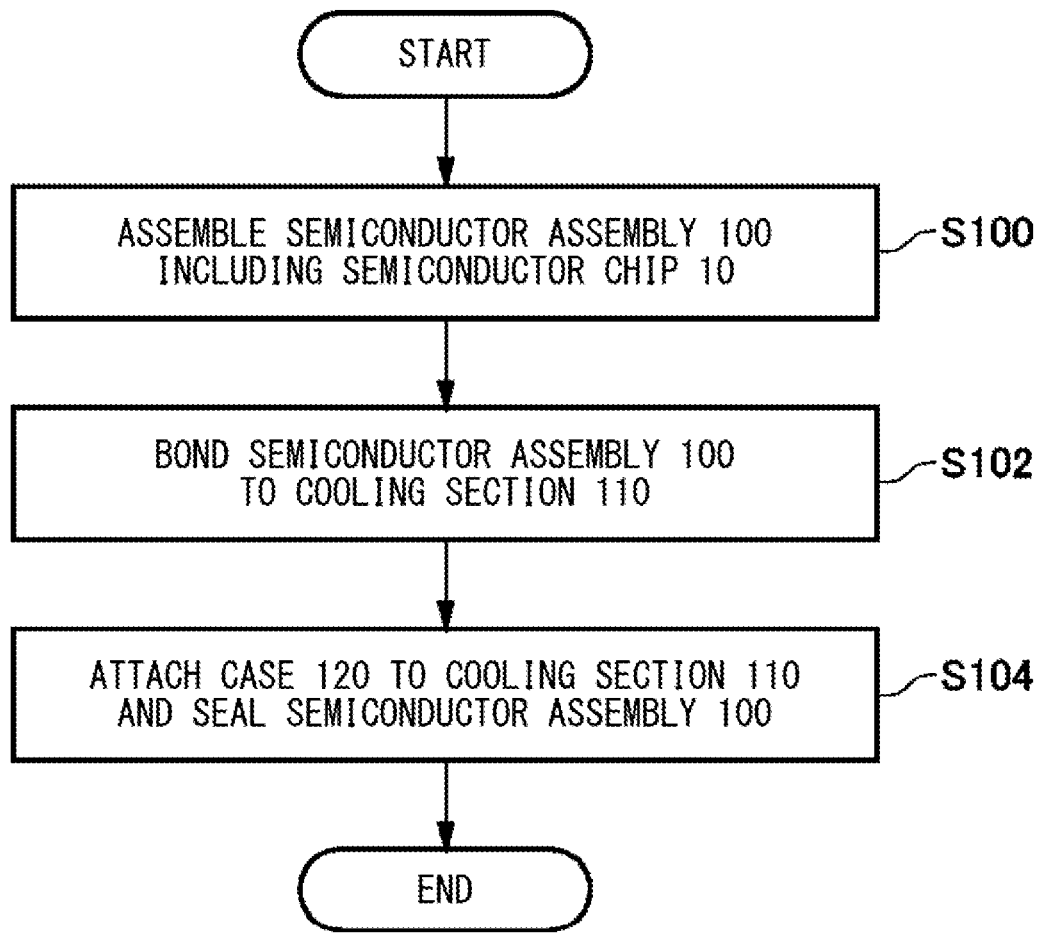
FIG. 8 shows an example of a flowchart for manufacturing the semiconductor module 300.

FIG. 8 shows an example of a flowchart for manufacturing a semiconductor module 300. In the step S100, a semiconductor 100 including a semiconductor chip 10 is assembled. Concrete method of assembling a semiconductor assembly 100 will be described later. In the step S102, the semiconductor assembly 100 is bonded to the cooling portion 110. Otherwise, assembling of the semiconductor assembly 100 may be completed after bonding the semiconductor 100 to the cooling portion 110. In the step S104, a case 120 is attached to the cooling portion 110, and the semiconductor assembly 100 is sealed by the sealing resin 130. In this way, the semiconductor module 300 is manufactured.

Figure 9A:
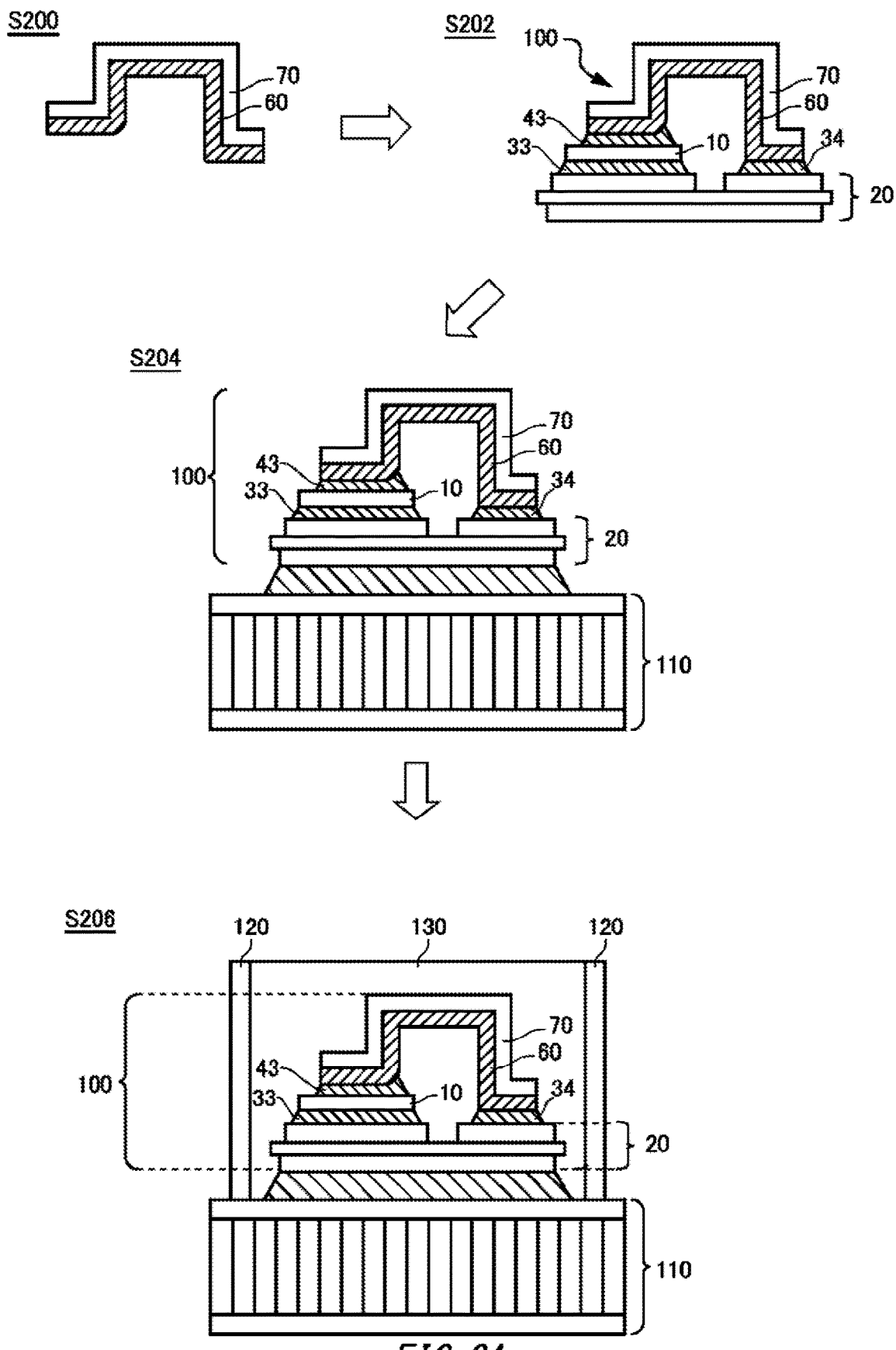
FIG. 9A shows an example of a manufacturing method for the semiconductor module 300.

FIG. 9A shows an example of manufacturing method for a semiconductor module 300. In the present example, the metal wiring plate 60 is solder-bonded to an upper part of the semiconductor chip 10, after applying the low elastic sheet 70 to the metal wiring plate 60.

In the step S200, the low elastic sheet 70 is affixed to the metal wiring plate 60 via an adhesive. The low elastic sheet 70 may be affixed after perforating the metal wiring plate 60, or the metal wiring plate 60 may be perforated after affixing the low elastic sheet 70 with a metal plate before perforation.

In the step S202, the metal wiring plate 60 applied with the low elastic sheet 70 is solder-bonded to the semiconductor chip 10 via the solder portion 43 to assemble the semiconductor assembly 100. The low elastic sheet 70 is formed of a material having heat resistance against a solder reflow. Temperature of the solder reflow is higher than the temperature for curing the sealing resin 130. In this case, if the low elastic sheet 70 has the heat resistance against the solder reflow, the low elastic sheet 70 also has the heat resistance for curing the sealing resin 130.

In the step S204, the semiconductor assembly 100 is placed on the cooling portion 110. In the step S206, the case 120 is mounted, and the semiconductor assembly 100 is sealed by the sealing resin 130. The processes of the step S204 and the step S206 are not particularly limited.

FIG. 9B shows an example of manufacturing method for a semiconductor module 300. In the present example, the low elastic sheet 70 is applied, after solder-bonding the metal wiring plate 60 to an upper part of the semiconductor chip 10.

In the step S300, the metal wiring plate 60 is solder-bonded to the semiconductor chip 10 via the solder portion 43 to assemble the semiconductor assembly 100. In the step S302, the semiconductor assembly 100 is placed on the cooling portion 110.

In the step S302, the low elastic sheet 70 is affixed to the metal wiring plate 60. The low elastic sheet 70 may be affixed to the entire surface of the metal wiring plate 60 as shown in the working example 1, or may be affixed to a part of the metal wiring plate 60. The low elastic sheet 70 may be affixed to the metal wiring plate 60 with an adhesive. Material of the low elastic sheet 70 may not have the heat resistance against the solder reflow, as long as it has the heat resistance against the temperature for curing the sealing resin 130. Then, similarly to the case of the step S206 in FIG. 9A, the case 120 is mounted, and the semiconductor assembly 100 is sealed by the sealing resin 130.

Figure 10A:
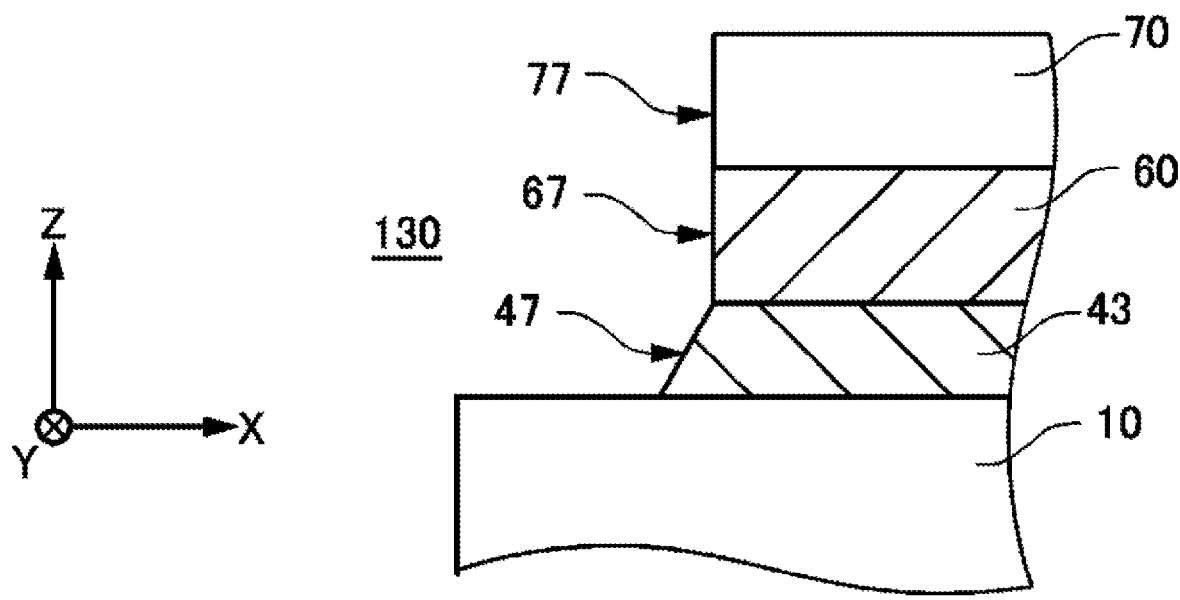
FIG. 10A is a partially enlarged view for explaining the end portion of the low elastic sheet 70 according to the working example.

FIG. 10A is a partially enlarged view for explaining the end of the low elastic sheet 70 according to the working example. The low elastic sheet 70 of the present example is provided so as to extend to the end portion of the metal wiring plate 60. The end portion of the low elastic sheet 70 substantially corresponds to the end portion of the metal wiring plate 60. Namely, the side surface 77 of the low elastic sheet 70 and the side surface 67 of the metal wiring plate 60 form substantially the same plane. The side surface 77 is a part of the bonding portion 72 according to the working example. The side surface 67 is a part of the bonding portion 62 according to the working example.

The sealing resin 130 is in contact with the side surface 67 and the side surface 77. Namely, the low elastic sheet 70 is not in contact with the side surface 67 of the bonding portion 62. As such, the sealing resin 130 is in contact with the side surface 67. Since the low elastic sheet 70 has a sheet-like shape, even if it is provided so as to extend to the end portion of the metal wiring plate 60, it can be positioned not to be in contact with the side surface 67.

Moreover, the sealing resin 130 is in contact with the side surface 47 of the solder portion 43. Namely, the low elastic sheet 70 is not in contact with the side surface 47 of the solder portion 43. The sealing resin 130 is also in contact with the semiconductor chip 10, the metal wiring plate 60 and the low elastic plate 70. The sealing resin 130 of the present example can suppress cracks occurring in the solder portion 43 by means of sealing and fixing the semiconductor chip 10, the solder portion 43 and the metal wiring plate 60.

Figure 10B:
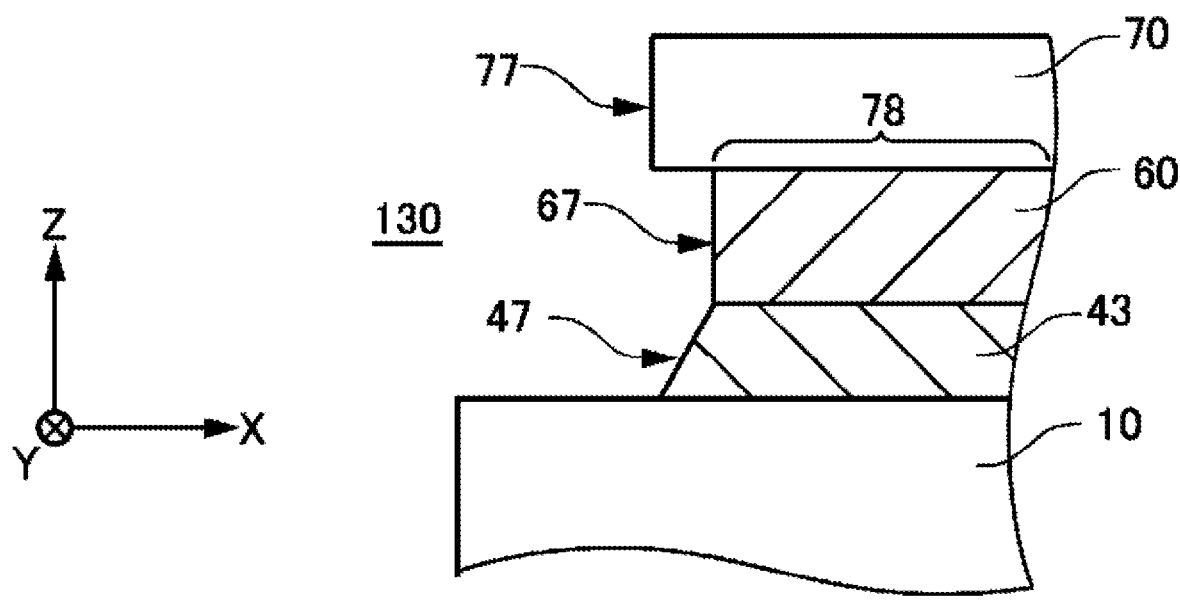
FIG. 10B is a partially enlarged view for explaining the end portion of the low elastic sheet 70 according to the working example.

FIG. 10B is a partially enlarged view for explaining the end of a low elastic sheet 70 according to a working example. The low elastic sheet 70 of the present example is provided to protrude out of the end portion of the metal wiring plate 60.

The low elastic sheet 70 is provided to protrude outwardly out of the interface 78 with the metal wiring plate 60. "Outward" in the present example means the negative X-axis direction from the interface 78. When the low elastic sheet 70 protrudes outwardly out of the interface 78 with the metal wiring plate 60, it becomes easier to reduce the concentration of stress in the sealing resin 130. The low elastic sheet 70 may be provided so as to protrude, at the end portion of the bonding portion 62, outwardly out of the interface 78 with the metal wiring plate 60. The low elastic sheet 70 may protrude in a direction parallel to the XY plane out of the end portion of the metal wiring plate 60. The position of the end portion of the bonding portion 62 is not particularly limited. The end portion of the bonding portion 62 may be an end portion of the bonding portion 62 that is opposite to the rising portion 63. It should be noted that the low elastic sheet 70 is provided being spaced apart from the solder portion 43. Namely, when the solder portion 43 is fixed by the sealing resin 130, the fixing force of the solder portion 43 is enhanced, so that generation of solder cracks can be suppressed. Accordingly, in the semiconductor module 300 of the present example, solder cracks can be suppressed, while electrode cracks and resin cracks can be prevented, enabling to realize longer lifetime.

For example, the low elastic sheet 70 has an elastic modulus of 1 MPa or higher and 1000 MPa or lower. When it has the elastic modulus of 1000 MPa or lower, the plastic strain amplitude (%) of the semiconductor chip 10 can be reduced, eventually, electrode cracks can be suppressed. Moreover, the low elastic sheet 70 may have the elastic modulus of 100 MPa or lower. When the low elastic sheet 70 has the elastic modulus of 100 MPa or lower, it is possible to reduce the stress generation of the sealing resin 530, eventually resin cracks can be suppressed.

Figure 11A:
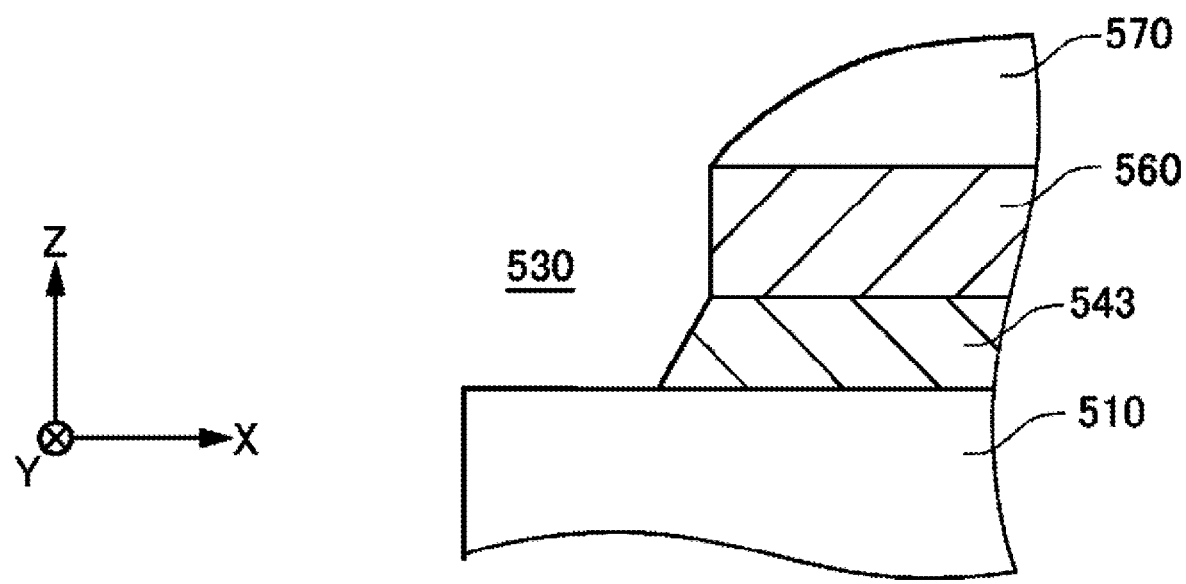
FIG. 11A is a partially enlarged view for explaining the end portion of a low elastic portion 570 according to the comparative example.

FIG. 11A is a partially enlarged view for explaining the end of a low elastic portion 570 according to the comparative example. In the semiconductor module 500 of the present example, a metal wiring plate 560 is provided on the semiconductor chip 510 via a solder portion 543. Moreover, a low elastic portion 570 is provided on the metal wiring plate 560.

The low elastic portion 570 is provided on the metal wiring portion 560 by means of applying liquid. As such, the film thickness of the elastic portion 570 does not become uniform, so the thickness of the end portion of the low elastic portion 570 becomes thinner. Accordingly, the stress at the end portion of the metal wiring plate 560 cannot be sufficiently reduced. Consequently, particularly at the end portion of the metal wiring plate 560 in the neighborhood of the semiconductor chip 510, there may arise a case where a large stress arises due to the difference of the elastic modulus of the metal wiring plate 560 and the elastic modulus of the sealing resin 530.

Further, if it is attempted to apply the low elastic portion 570 so as to extend to the end portion of the metal wiring plate 560 when applying the low elastic portion 570, the low elastic portion 570 may stick to the solder portion 543. If the low elastic portion 570 sticks to the solder portion 543, the fixing force of the solder will be lowered, and this may cause a solder crack.

Figure 11B:
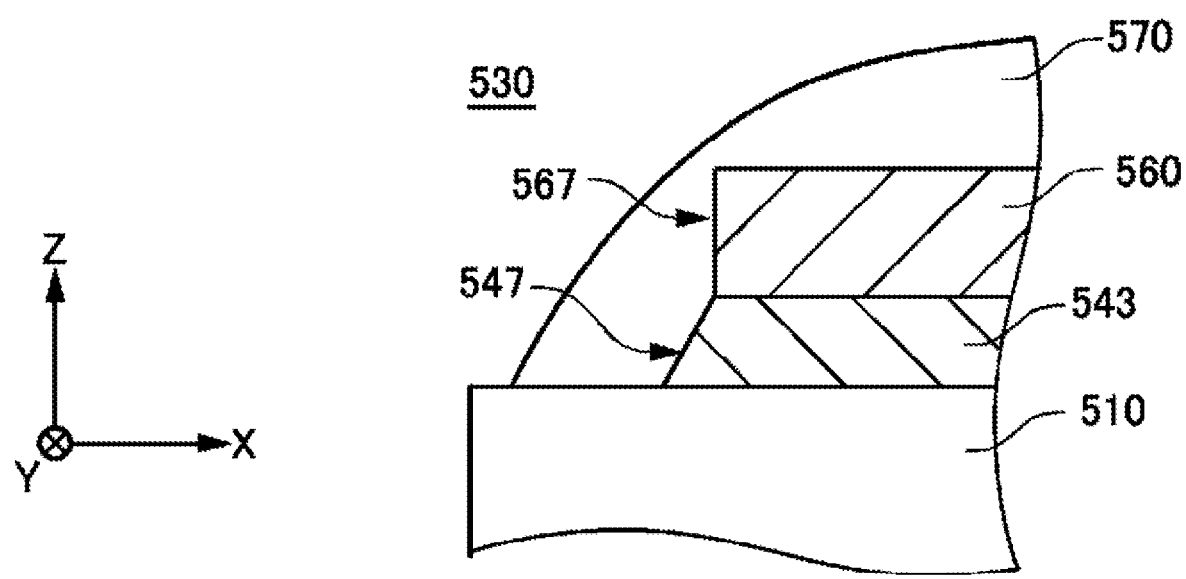
FIG. 11B is a partially enlarged view for explaining the end portion of the low elastic portion 570 according to the comparative example.

FIG. 11B is a partially enlarged view for explaining the end of a low elastic portion 570 according to a comparative example. The low elastic portion 570 of the present example is provided so as to cover the side surface 567 of the metal wiring plate 560 and the side surface 547 of the solder portion 543. In this case, the metal wiring plate 560 cannot be fixed by a rigid resin such as the sealing resin 530, therefore, a solder crack may occur.

Figure 12:
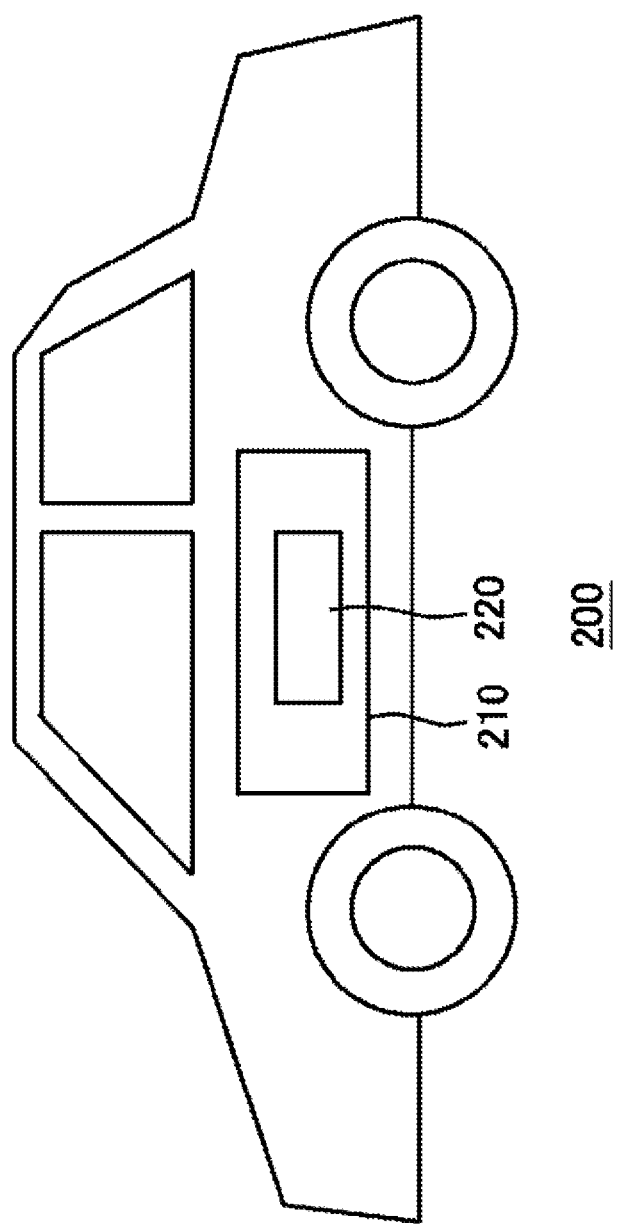
FIG. 12 is a view showing the outline of a vehicle 200 according to the working example.

FIG. 12 is a view showing the outline of a vehicle 200 according to a working example. The vehicle 200 is a vehicle which generates at least a part of its driving force using electricity. As an example, the vehicle 200 is an electric vehicle that generates all the driving force through a power driving device such as a motor, or a hybrid vehicle that use both a power driving device such as a motor and an internal combustion engine using fuel such as gasoline.

The vehicle 200 has a control device 210 (external device) for controlling the electrically-driven device such as a motor. The control device 210 is provided with a power conversion apparatus 220 including the semiconductor module 300. The power conversion apparatus 220 may control the electric power supplied to the power driving device. The semiconductor module 300 may be fixed to a control device 210 via a fastening member to be inserted. To the cooling portion 110 of the semiconductor module 300, a coolant may be supplied from the cooling system, which is connected through a pipe, of the control device 210.

Figure 13:
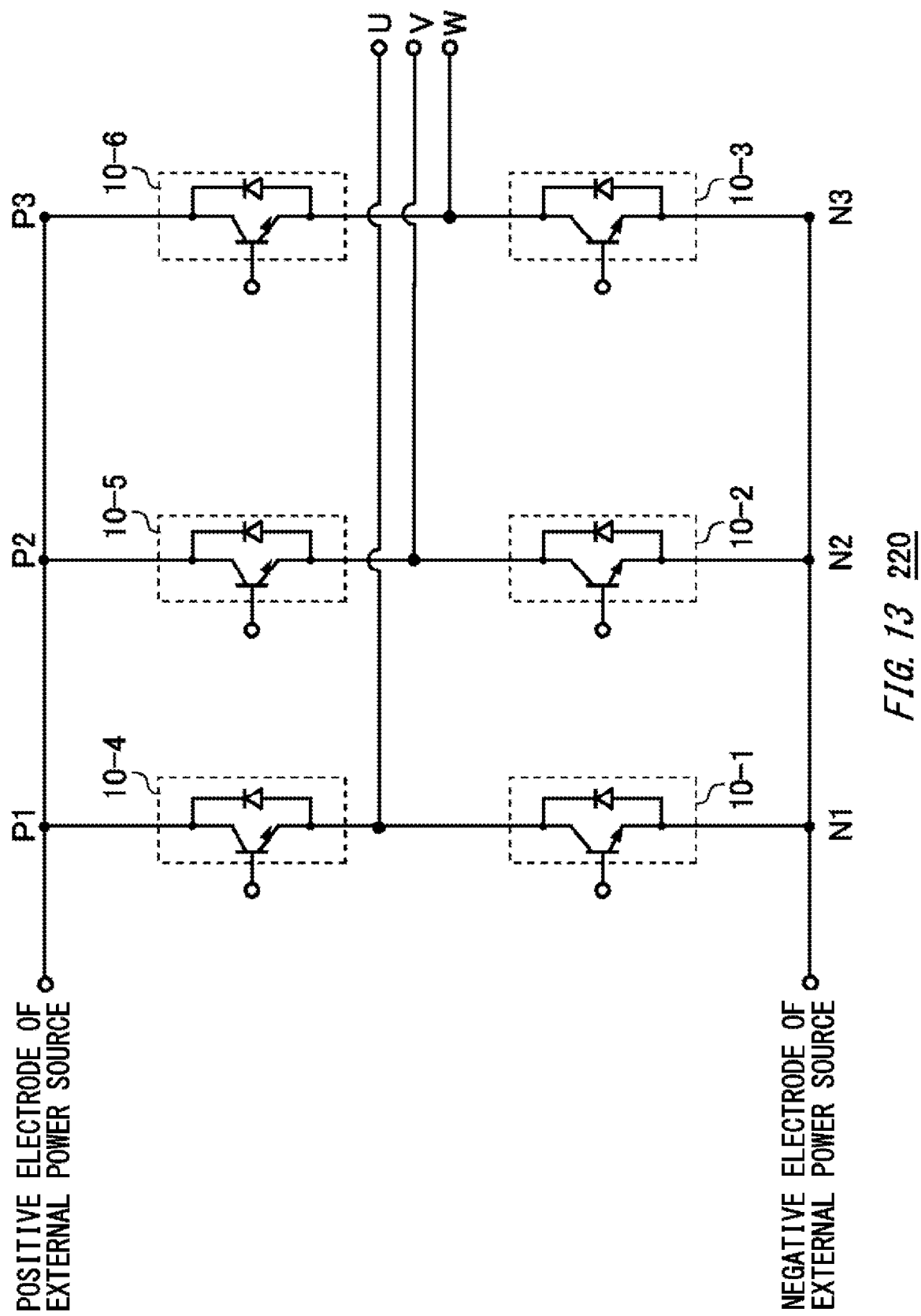
FIG. 13 is a main circuit diagram of a power conversion apparatus 220 according to the working example.

FIG. 13 is a main circuit diagram of a power converter 200 according to the working example. The power conversion apparatus 220 may be a part of an on-vehicle unit for driving the motor of the vehicle 200. The power conversion apparatus 220 may function as a three-phase alternating current inverter circuit having external power supply terminals P, N, and load terminals U, V.

The semiconductor chips 10-1, 10-2 and 10-3 may each constitute a lower arm in the power converter 220, and the plurality of semiconductor chips 10-4, 10-5 and 10-6 may each constitute an upper arm in the power conversion apparatus 220. A pair of the semiconductor chips 10-1 and 10-4 may constitute legs. Similarly, a pair of semiconductor chips 10-2 and 10-5, and a pair of semiconductor chips 10-3 and 10-6 may constitute legs. In the semiconductor chip 10-1, the upper surface electrode may be electrically connected to the power supply terminal N1, and the lower surface electrode may be electrically connected to the load terminal U. In the semiconductor chip 10-4, then upper surface electrode may be electrically connected to the load terminal U, and the lower surface electrode may be electrically connected to the power supply terminal P1. Similarly, in the semiconductor chips 10-2, 10-3, the upper surface electrode may each be electrically connected to the power supply terminal N2, N3, and the lower surface electrode may each be electrically connected to the load terminal V, W. Further, in the semiconductor chips 10-5, 10-6, the upper surface electrode may each be electrically connected to the load terminal V, W, and the lower surface electrode may each be electrically connected to the power supply terminal P2, P3.

Each of the semiconductor chips 10-1 to 10-6 may be alternately switched by the signals inputted to a controlling electrode pad of the semiconductor chip 10. In the present example, each semiconductor chip 10 may generate heat when switched. The power supply terminals P1, P2 and P3 may each be connected to a positive electrode of an external power source, and the power supply terminals N1, N2 and N3 may each be connected to a negative electrode, and the load terminals U, V and W may each be connected to a load. The power supply terminals P1, P2 and P3 may be electrically connected to each other, and other power supply terminals N1, N2 and N3 may also be electrically connected to each other.

While the examples of the present invention have been described, the technical scope of the invention is not limited to the above described embodiments. It is apparent to persons skilled in the art that various modifications and improvements can be added to the above-described examples. It is also apparent from the scope of the claims that the examples added with such modifications or improvements can be included in the technical scope of the invention.

The operations, procedures, steps, and stages of each process performed by an apparatus, system, program, and method shown in the claims, the descriptions, or drawings can be performed in any order as long as the order is not indicated by "prior to," "before," or the like and as long as the output from a previous process is not used in a later process. Even if the process flow is described using phrases such as "first" or "next" in the claims, the description, or drawings, it does not necessarily mean that the process must be performed in this order.

What is claimed is:
1. A semiconductor module comprising:
   a semiconductor chip having an upper surface electrode and a lower surface electrode opposite to said upper surface electrode;
   a metal wiring plate electrically connected to said upper surface electrode of said semiconductor chip, the metal wiring plate having an elastic modulus;
   a low elastic modulus sheet provided on said metal wiring plate, said low elastic modulus sheet having an elastic modulus lower than that of said metal wiring plate;
   a solder portion bonding said upper surface electrode of said semiconductor chip and said metal wiring plate; and
   a sealing resin sealing said semiconductor chip and said metal wiring plate;
   wherein said sealing resin is in contact with said solder portion,
   wherein said metal wiring plate has an upper surface,
   wherein said metal wiring plate includes:
   a bonding portion solder-bonded by the solder portion to said upper surface electrode of said semiconductor chip; and
   a rising portion connected to said bonding portion and extended in a direction away from said semiconductor chip, wherein the upper surface of said metal wiring plate is entirely provided with said low elastic modulus sheet thereon including said low elastic modulus sheet being provided on both of said bonding portion and said rising portion.

2. The semiconductor module according to claim 1, wherein said low elastic modulus sheet is provided to protrude out of an interface with said metal wiring plate at an end portion of said bonding portion.

3. The semiconductor module according to claim 1, wherein said low elastic modulus sheet has an interface with said metal wiring plate at an end portion of said bonding portion.

4. The semiconductor module according to claim 1, wherein said sealing resin is in contact with a side surface of said bonding portion of said metal wiring plate.

5. The semiconductor module according to claim 4, wherein said low elastic modulus sheet is provided to protrude out of an interface with said metal wiring plate at an end portion of said bonding portion.

6. The semiconductor module according to claim 1, wherein the sealing resin has an elastic modulus, and wherein the elastic modulus of said low elastic modulus sheet is lower than the elastic modulus of said sealing resin.

7. The semiconductor module according to claim 6, wherein the elastic modulus of said low elastic modulus sheet is greater than or equal to $1/10000$ of the elastic modulus of said sealing resin and less than or equal to $1/10$ of the elastic modulus of said sealing resin.

8. The semiconductor module according to claim 1, wherein said low elastic modulus sheet has an elastic modulus of 1 MPa or higher and 1000 MPa or lower.

9. The semiconductor module according to claim 1, wherein said low elastic modulus sheet has a thickness of 0.05 mm or more and 1.5 mm or less.

10. The semiconductor module according to claim 1, wherein said low elastic modulus sheet includes any one of foam, resin and silicone rubber.

11. A semiconductor module comprising:
a semiconductor chip having an upper surface electrode and a lower surface electrode opposite to said upper surface electrode;
a metal wiring plate electrically connected to said upper surface electrode of said semiconductor chip, the metal wiring plate having an elastic modulus,
wherein said metal wiring plate includes:
a bonding portion for providing bonding to said upper surface electrode of said semiconductor chip; and
a rising portion connected to said bonding portion and extended in a direction away from said semiconductor chip;
a low elastic modulus sheet provided on said metal wiring plate, said low elastic modulus sheet having an elastic modulus lower than that of said metal wiring plate;
a solder portion for bonding said upper surface electrode of said semiconductor chip and said metal wiring plate; and
a sealing resin sealing said semiconductor chip and said metal wiring plate,
wherein said bonding portion is solder-bonded by said solder portion to said upper surface electrode of said semiconductor chip,
wherein said low elastic modulus sheet is provided to protrude out of an interface with said metal wiring plate at an end portion of said bonding portion,
wherein said sealing resin is in contact with a side surface of said bonding portion of said metal wiring plate that is farthest from the rising portion, and
wherein the low elastic modulus sheet is spaced apart from the solder portion.

12. The semiconductor module according to claim 11, wherein the rising portion is a portion bent at an angle relative to the bonding portion.

* * * * *